US011114608B2

(12) United States Patent
Sun et al.

(10) Patent No.: US 11,114,608 B2
(45) Date of Patent: Sep. 7, 2021

(54) COMBINED SPIN-ORBIT TORQUE AND SPIN-TRANSFER TORQUE SWITCHING FOR MAGNETORESISTIVE DEVICES AND METHODS THEREFOR

(71) Applicant: Everspin Technologies, Inc., Chandler, AZ (US)

(72) Inventors: Jijun Sun, Chandler, AZ (US); Shimon, Singapore (SG); Han-Jong Chia, Hsinchu (TW)

(73) Assignee: Everspin Technologies Inc., Chandler, AZ (US)

( * ) Notice: Subject to any disclaimer, the term of this patent is extended or adjusted under 35 U.S.C. 154(b) by 0 days.

(21) Appl. No.: 16/519,741

(22) Filed: Jul. 23, 2019

(65) Prior Publication Data

US 2020/0035909 A1  Jan. 30, 2020

Related U.S. Application Data

(60) Provisional application No. 62/703,074, filed on Jul. 25, 2018.

(51) Int. Cl.
*H01L 43/04* (2006.01)
*G11C 11/16* (2006.01)
(Continued)

(52) U.S. Cl.
CPC .......... *H01L 43/04* (2013.01); *G11C 11/161* (2013.01); *H01L 27/222* (2013.01); *H01L 43/065* (2013.01); *H01L 43/14* (2013.01)

(58) Field of Classification Search
CPC ..... H01L 43/04; H01L 27/222; H01L 43/065; H01L 43/14; H01L 43/08; G11C 11/161; G11C 11/18
See application file for complete search history.

(56) References Cited

U.S. PATENT DOCUMENTS

| 2008/0225585 A1* | 9/2008 | Ranjan | G11C 11/161 |
| | | | 365/173 |
| 2014/0153324 A1* | 6/2014 | Yu | G11C 11/155 |
| | | | 365/158 |

(Continued)

FOREIGN PATENT DOCUMENTS

CN 107658382 A 2/2018

OTHER PUBLICATIONS

International Search Report in PCT/US2019/043002, dated Oct. 10, 2019 (6 pages).

*Primary Examiner* — Thanh Y. Tran
(74) *Attorney, Agent, or Firm* — Bookoff McAndrews, PLLC

(57) ABSTRACT

Spin-Hall (SH) material is provided near free regions of magnetoresistive devices that include magnetic tunnel junctions. Current flowing through such SH material injects spin current into the free regions such that spin torque is applied to the free regions. The spin torque generated from SH material can be used to switch the free region or to act as an assist to spin-transfer torque generated by current flowing vertically through the magnetic tunnel junction, in order to improve the reliability, endurance, or both of the magnetoresistive device. Further, one or more additional regions or manufacturing steps may improve the switching efficiency and the thermal stability of magnetoresistive devices.

20 Claims, 20 Drawing Sheets

(51) Int. Cl.
*H01L 27/22* (2006.01)
*H01L 43/06* (2006.01)
*H01L 43/14* (2006.01)

(56) References Cited

U.S. PATENT DOCUMENTS

2015/0348606 A1 12/2015 Buhrman et al.
2016/0079518 A1 3/2016 Pi et al.
2018/0061887 A1 3/2018 Braganca

* cited by examiner

COMBINED SPIN-ORBIT TORQUE AND SPIN-TRANSFER TORQUE SWITCHING FOR MAGNETORESISTIVE DEVICES AND METHODS THEREFOR

CROSS-REFERENCE TO RELATED APPLICATIONS

This application claims the benefit of priority from U.S. Provisional Application No. 62/703,074, filed on Jul. 25, 2018, which is incorporated by reference herein in its entirety.

TECHNICAL FIELD

The present disclosure relates to, among other things, magnetoresistive devices and methods for fabricating and/or using the disclosed magnetoresistive devices.

INTRODUCTION

In one or more embodiments, the present disclosure relates to a magnetoresistive device having a magnetoresistive stack or structure (for example, part of a magnetoresistive memory device and/or magnetoresistive sensor/transducer device) and methods of manufacturing and operating the described magnetoresistive devices. In one embodiment, an exemplary magnetoresistive stack (for example, used in a magnetic tunnel junction (MTJ) magnetoresistive device) of the present disclosure includes one or more layers of magnetic or ferromagnetic material.

Briefly, a magnetoresistive stack used in a memory device (e.g., a magnetoresistive random access memory (MRAM)) of the present disclosure includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information is stored in the magnetoresistive memory stack by switching, programming, and/or controlling the direction of magnetization vectors in the magnetic layer(s) of the "free" magnetic region. The direction of the magnetization vectors of the "free" magnetic region may be switched and/or programmed (for example, through spin orbit torque (SOT) and/or spin transfer torque (STT)) by application of a write signal (e.g., one or more current pulses) adjacent to, or through, the magnetoresistive memory stack. In contrast, the magnetization vectors in the magnetic layers of a "fixed" magnetic region are magnetically fixed in a predetermined direction during application of the write signal. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack has a second magnetic state. The magnetoresistive memory stack has different electrical resistances in the first and second magnetic states. For example, a resistance (e.g., electrical) of the second magnetic state may be relatively higher than a resistance of the first magnetic state. The magnetic state of the magnetoresistive memory stack is determined or read based on the resistance of the stack in response to a read current applied, for example, through the magnetoresistive stack.

As magnetic memory devices (e.g., MRAM) advance towards smaller process nodes to increase density, individual MTJ bit sizes must laterally shrink to accommodate tighter pitch and space between bits. However, as the size and/or aspect ratio of the MTJ bit decreases, so does its shape magnetic anisotropy. With the decrease in shape anisotropy, the energy barrier of the MTJ may decrease. As the energy barrier decreases, however, the data retention and/or thermal stability of the MTJ bit also may decrease. Typically, the decrease in energy barrier of the MTJ bit may be corrected by increasing the perpendicular anisotropy or magnetic moment of the "free" region by altering its composition/material/thickness. However, doing so also may raise the critical current (described in greater detail below) of the MTJ bit. MTJ bits with high critical currents undergo a greater amount of periodic damage and degeneration during write and/or reset operations and negatively impact MTJ device (i.e. MRAM) endurance.

The present disclosure relates to devices and methods for writing or otherwise switching the magnetic state of a magnetoresistive memory device via STT and/or SOT switching schemes. More particularly, the description that follows describes embodiments of MTJ geometries which integrate SOT and/or STT switching mechanics, individually or in combination, to provide improved switching efficiency, enabling the switching of a high energy barrier MTJ bit without the use of unnecessary high magnitudes of write current. The scope of the current disclosure, however, is defined by the attached claims, and not by any characteristics of the resulting devices or methods.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. The drawings are simplifications provided to help illustrate the relative positioning of various regions/layers and describe various processing steps. One skilled in the art would appreciate that the regions are not necessarily drawn to scale and should not be viewed as representing proportional relationships between different regions/layers. Moreover, while certain regions/layers and features are illustrated with straight 90-degree edges, in actuality or practice such regions/layers may be more "rounded", curved, and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 1:
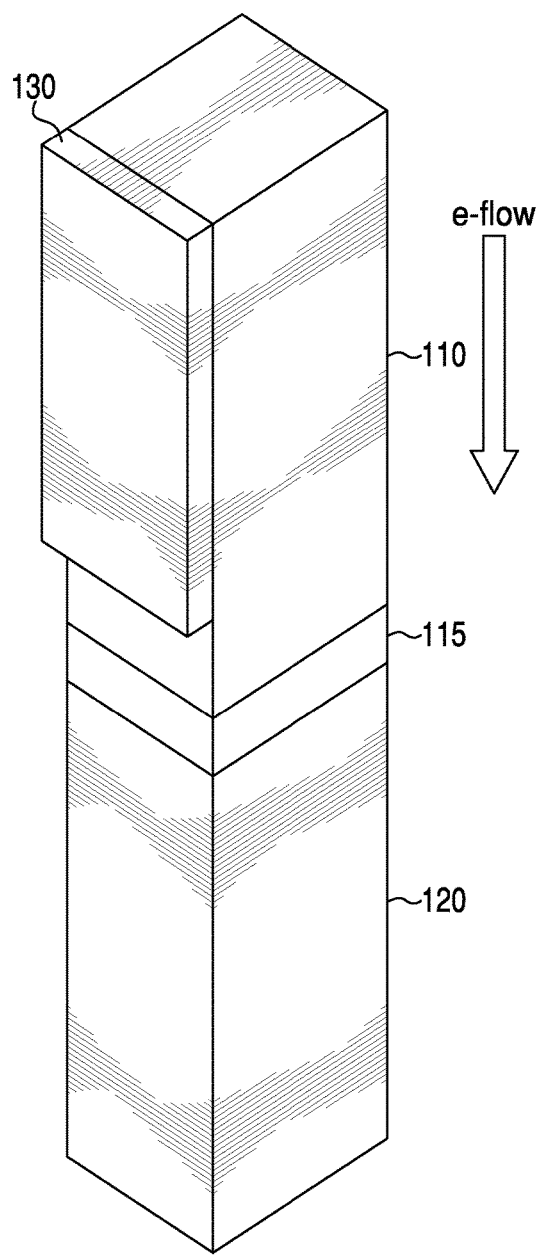
Figure 2A:
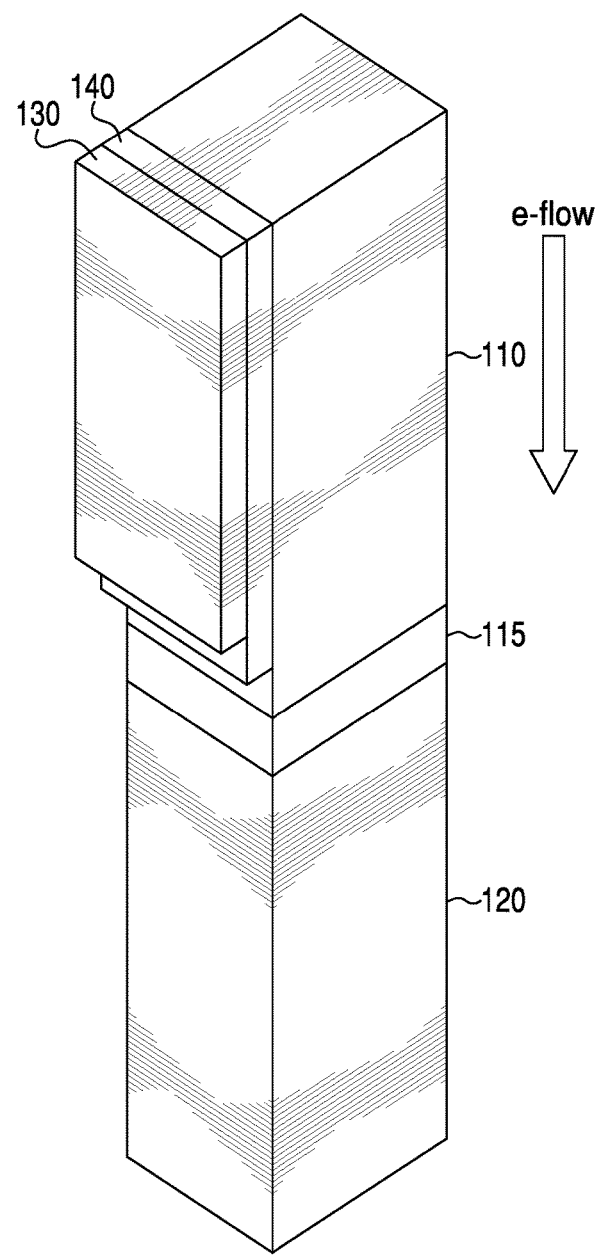
Figure 2B:
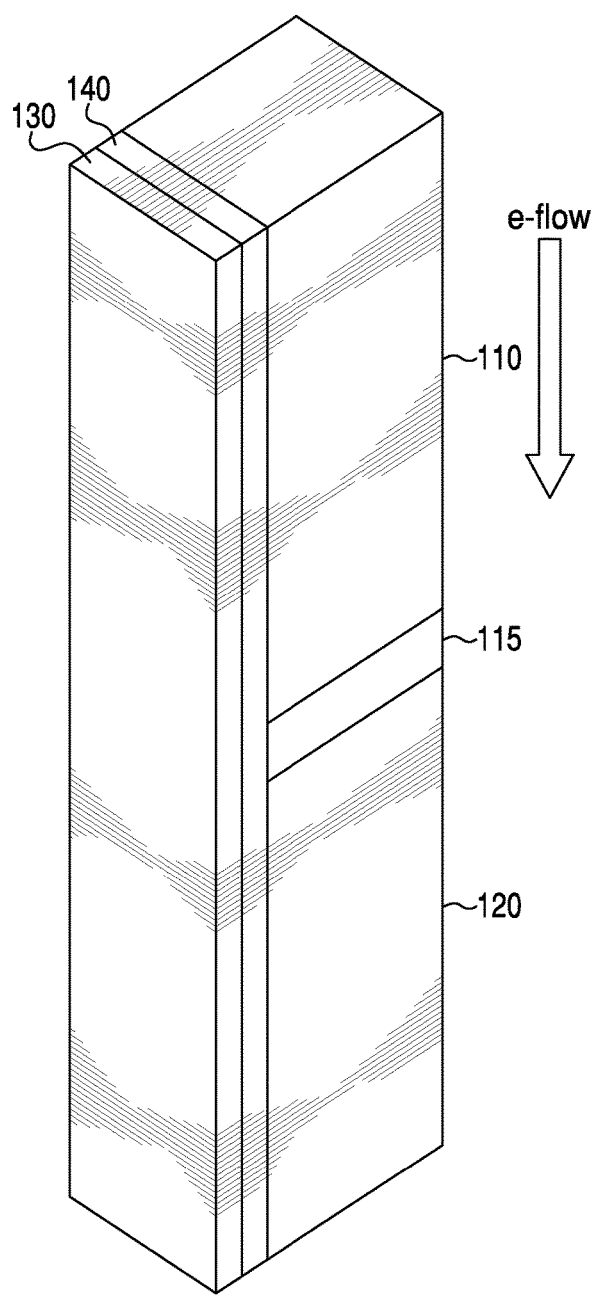
Figure 3:
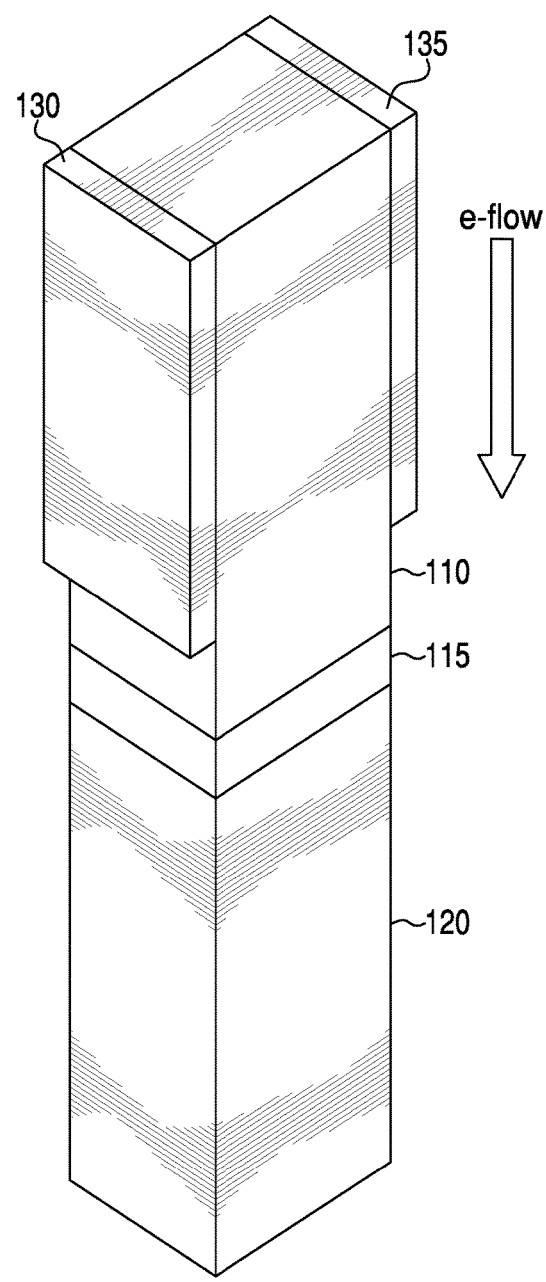
Figure 4A:
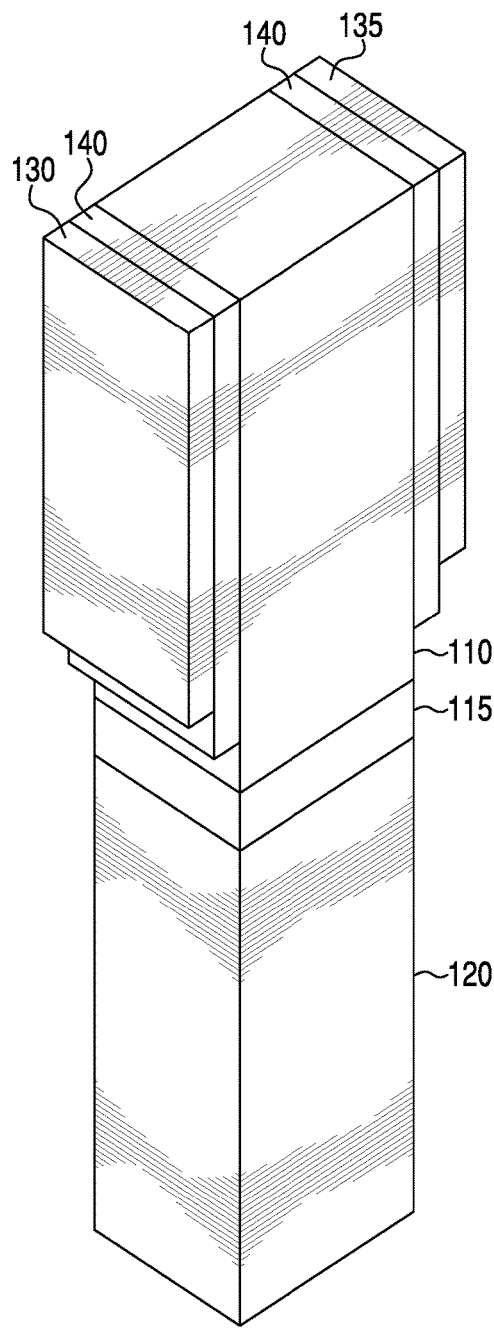
Figure 4B:
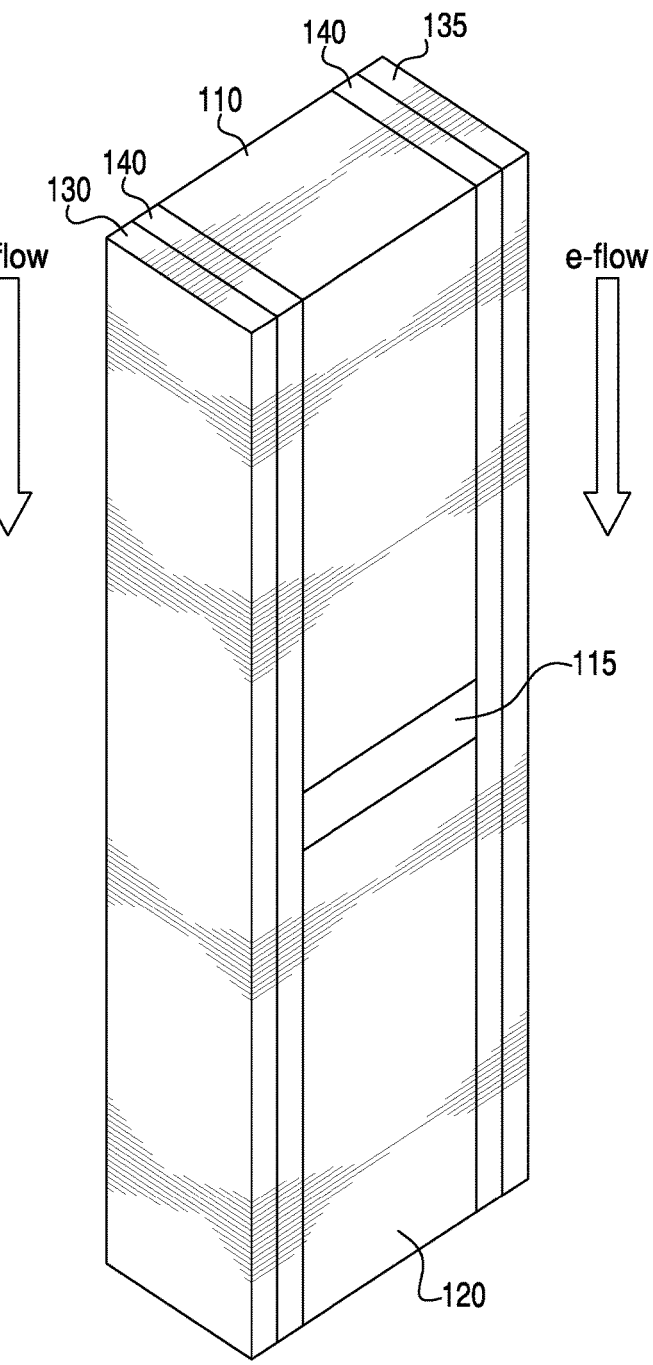
Figure 5A:
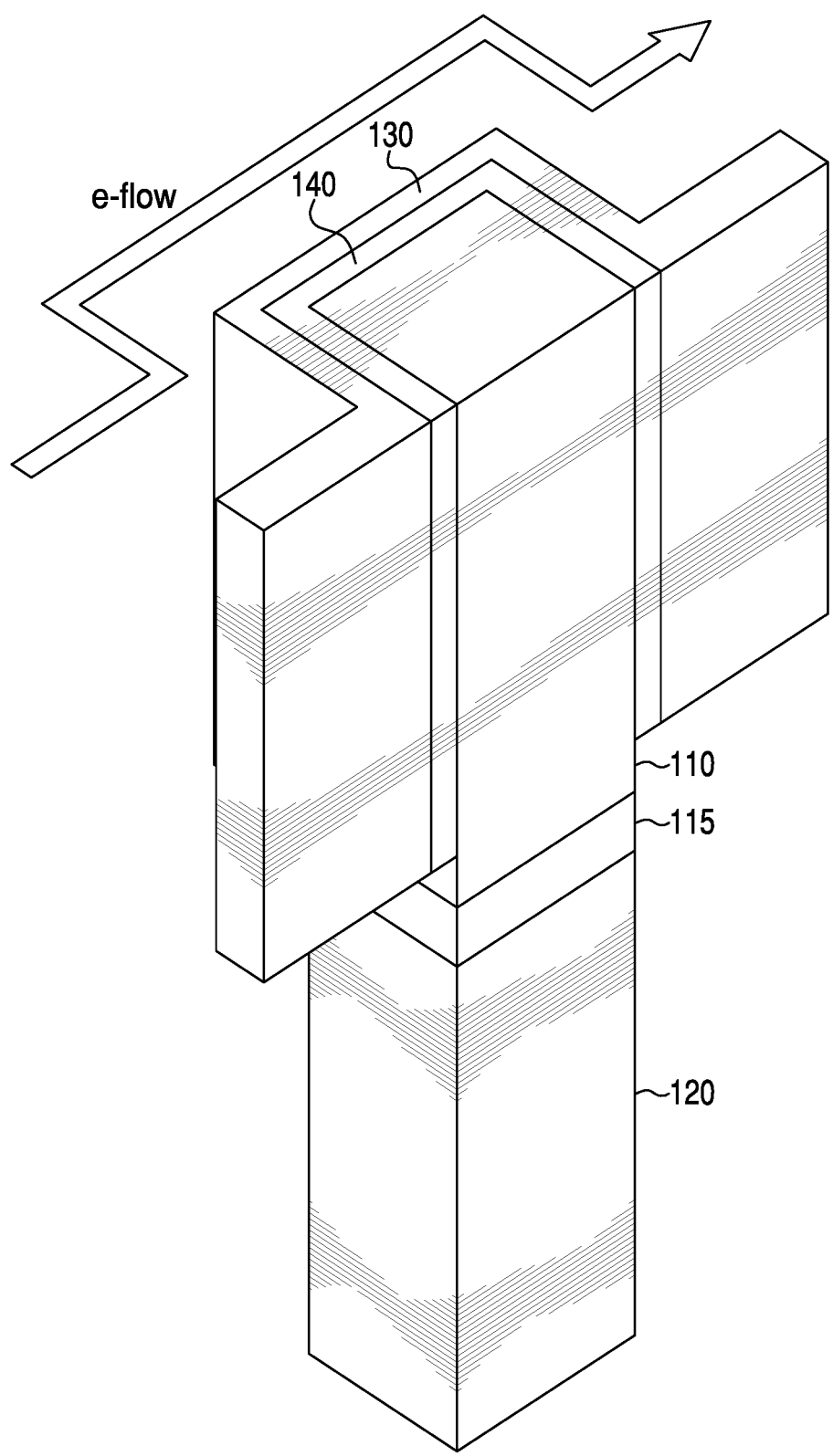
Figure 5B:
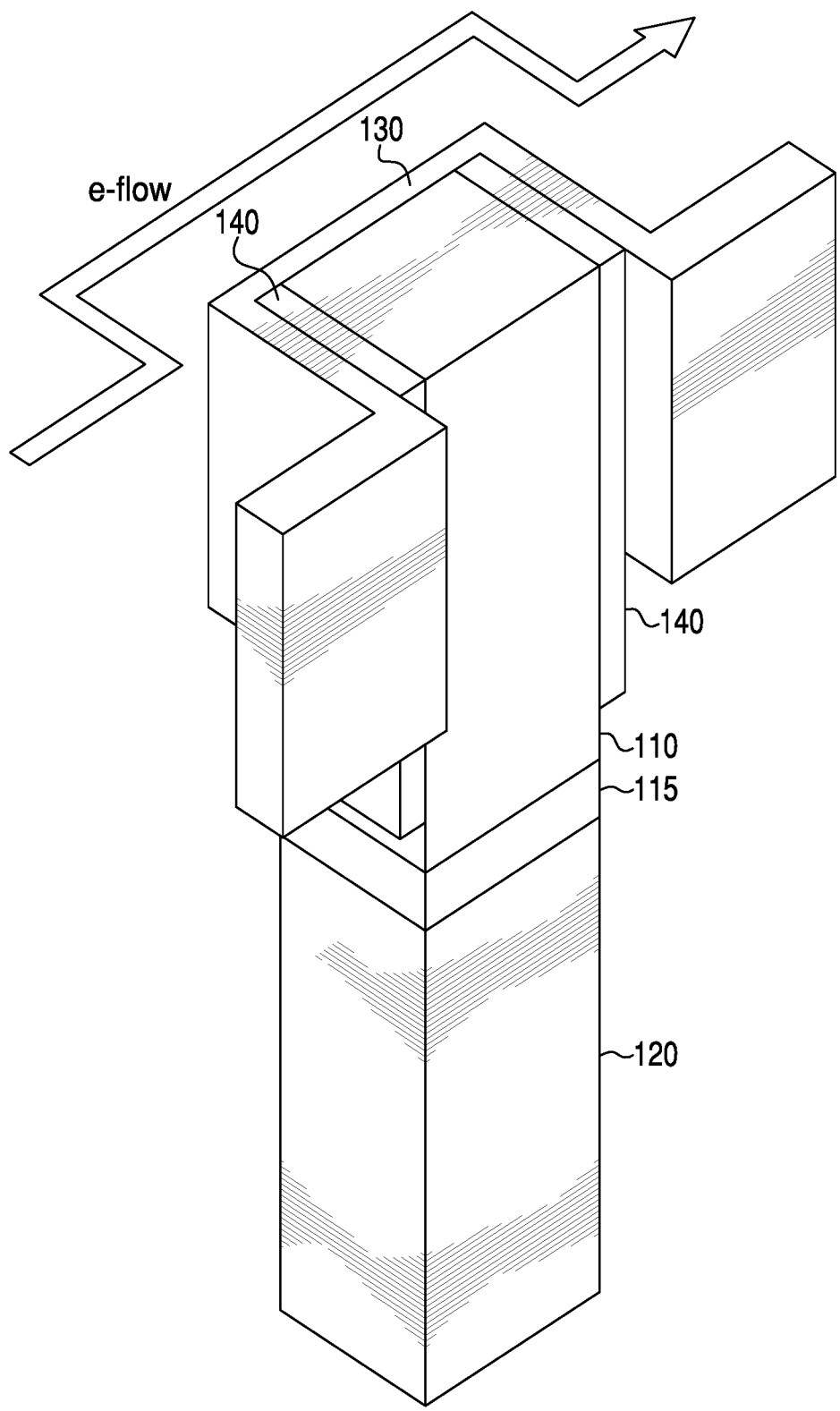
Figure 5C:
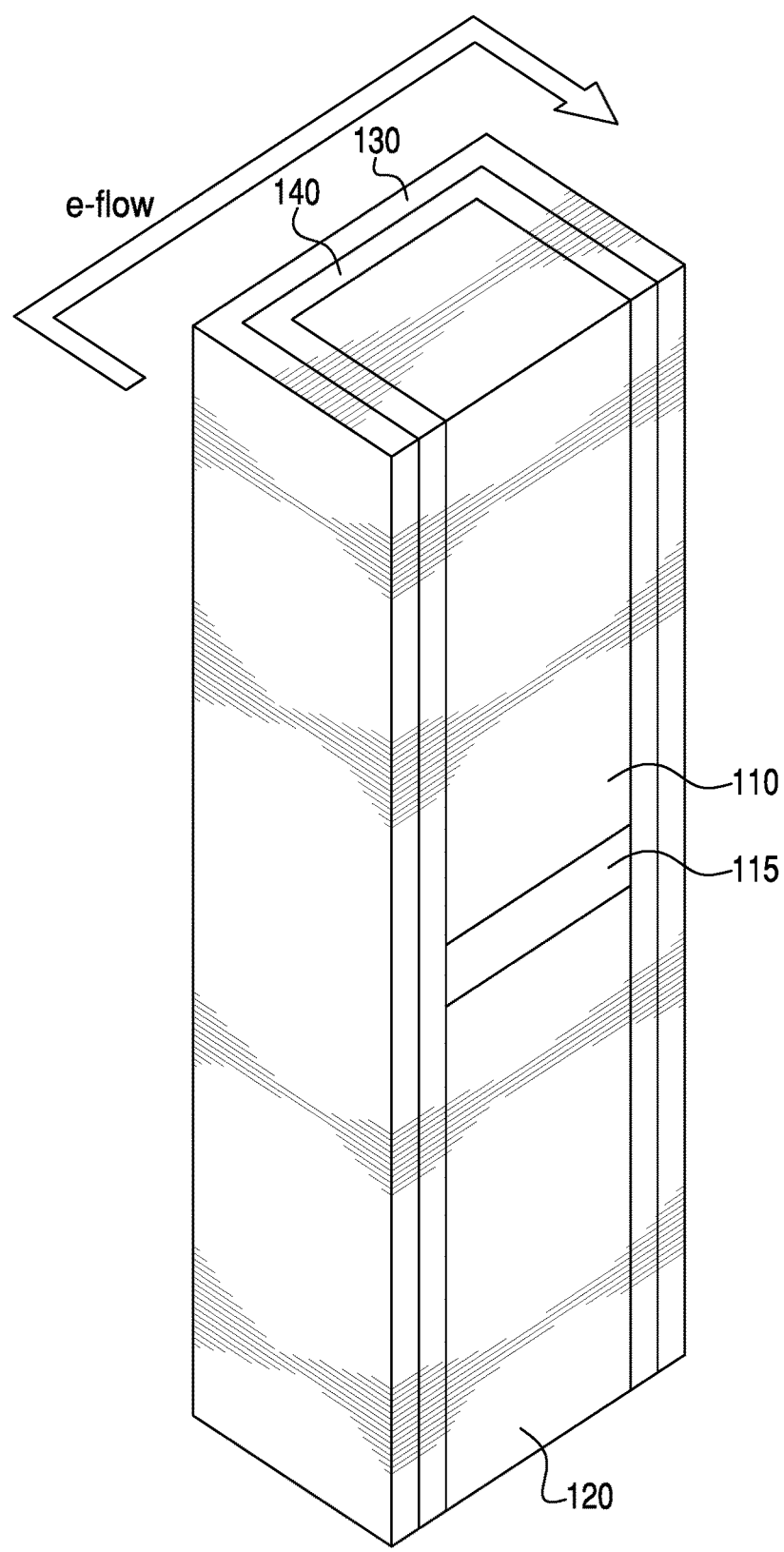
Figure 6A:
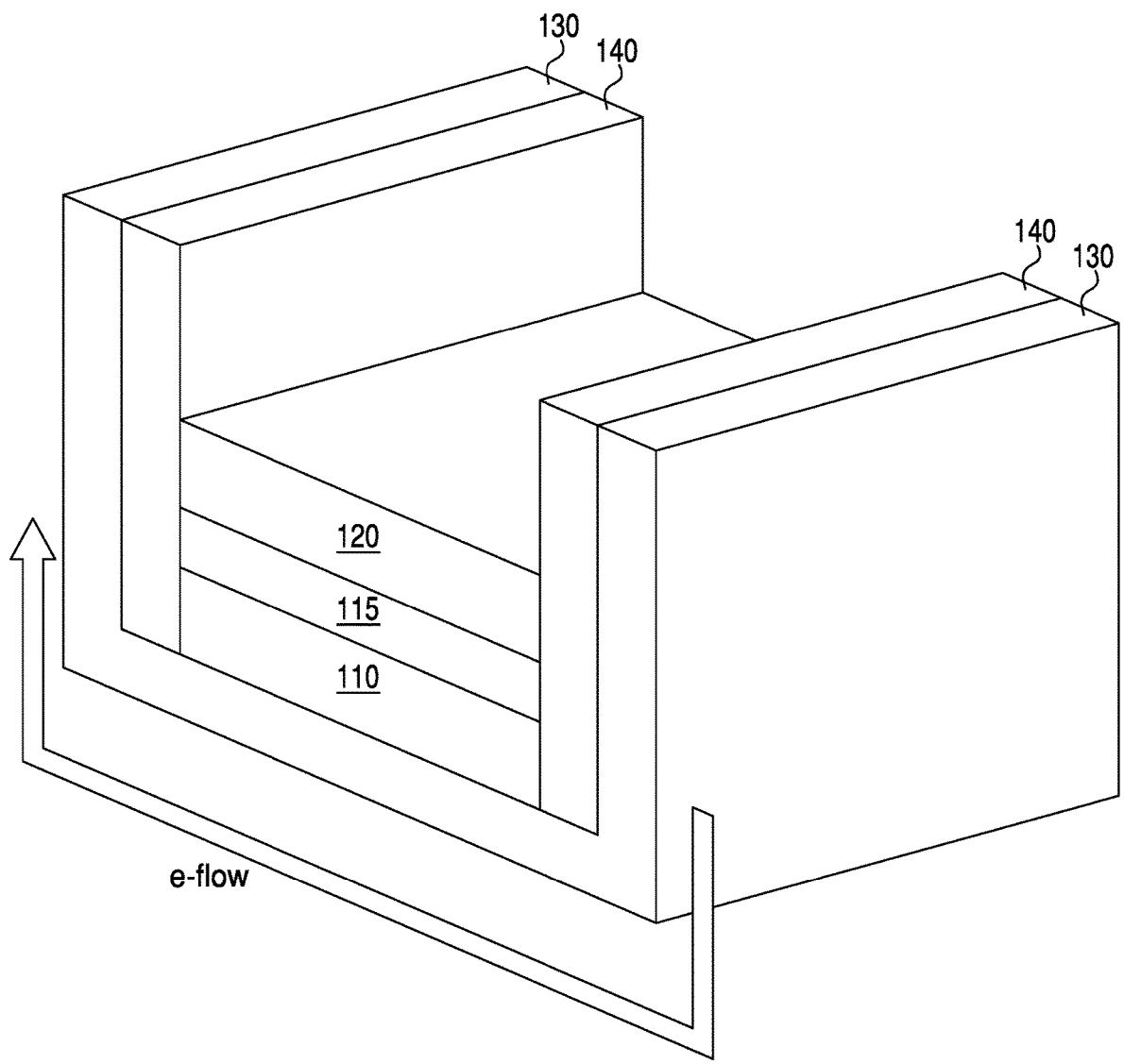
Figure 6B:
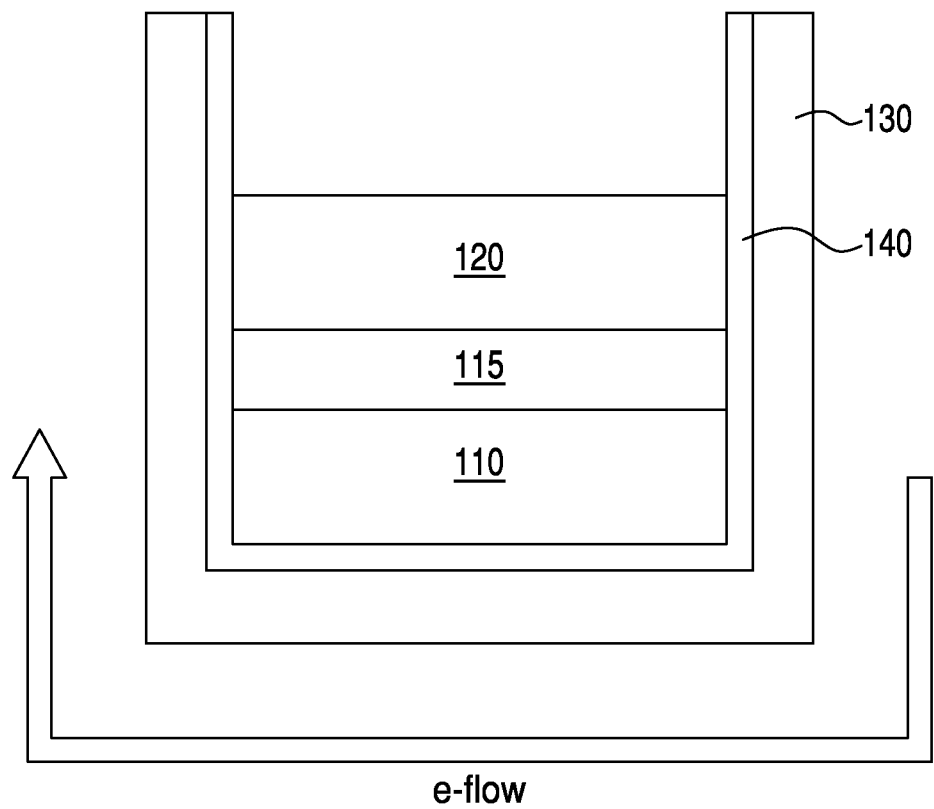
Figure 7B:
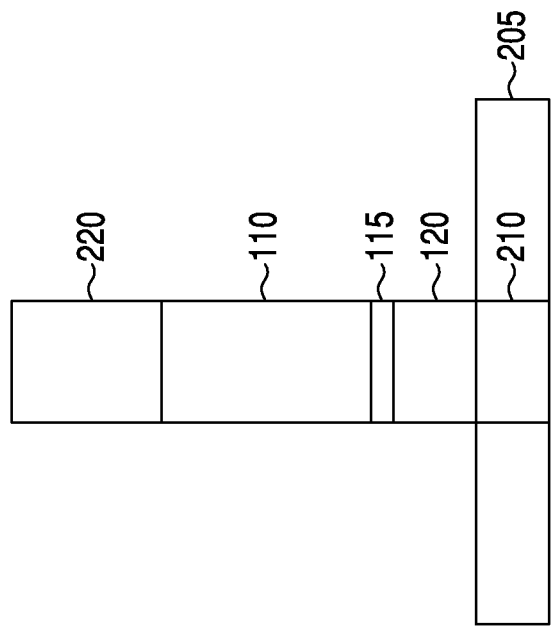
Figure 7A:
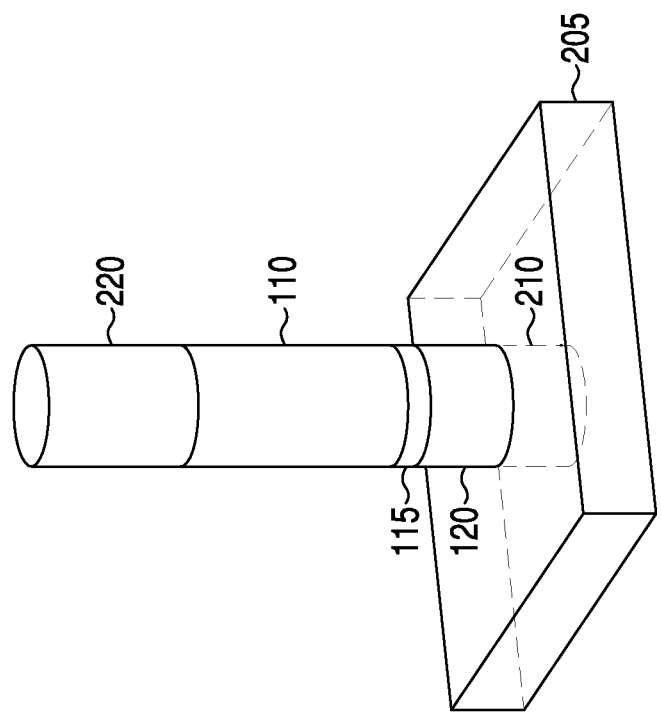
Figure 8B:
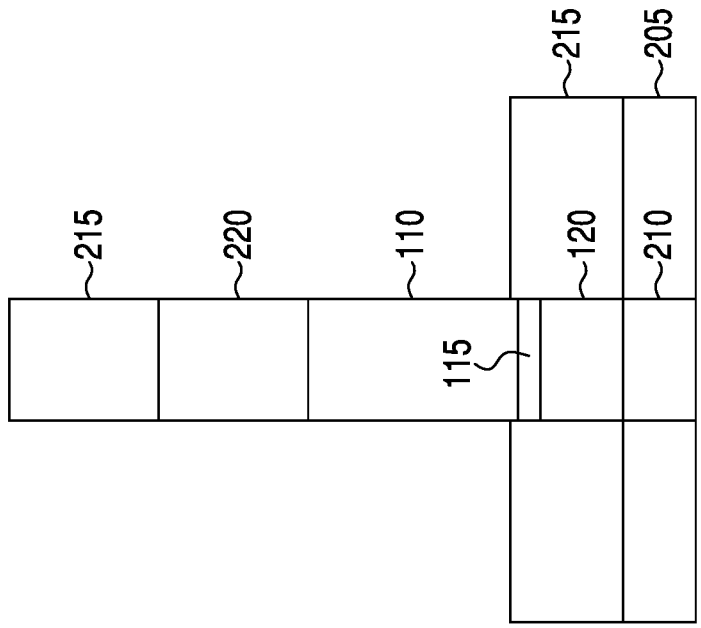
Figure 8A:
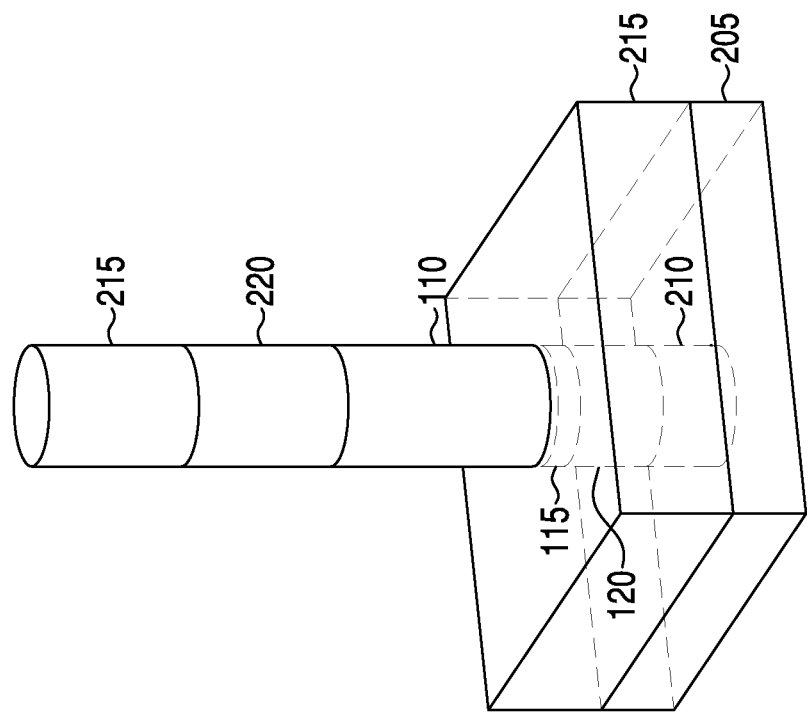
Figure 9B:
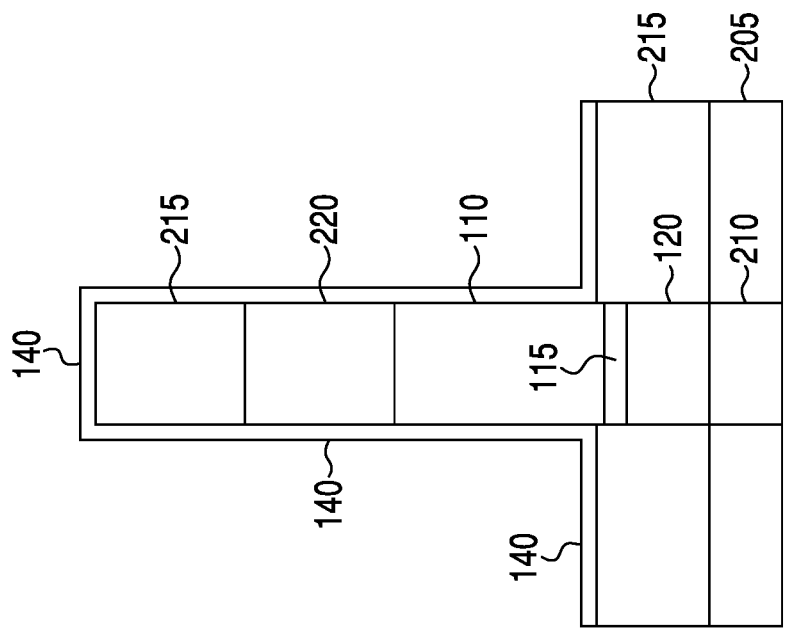
Figure 9A:
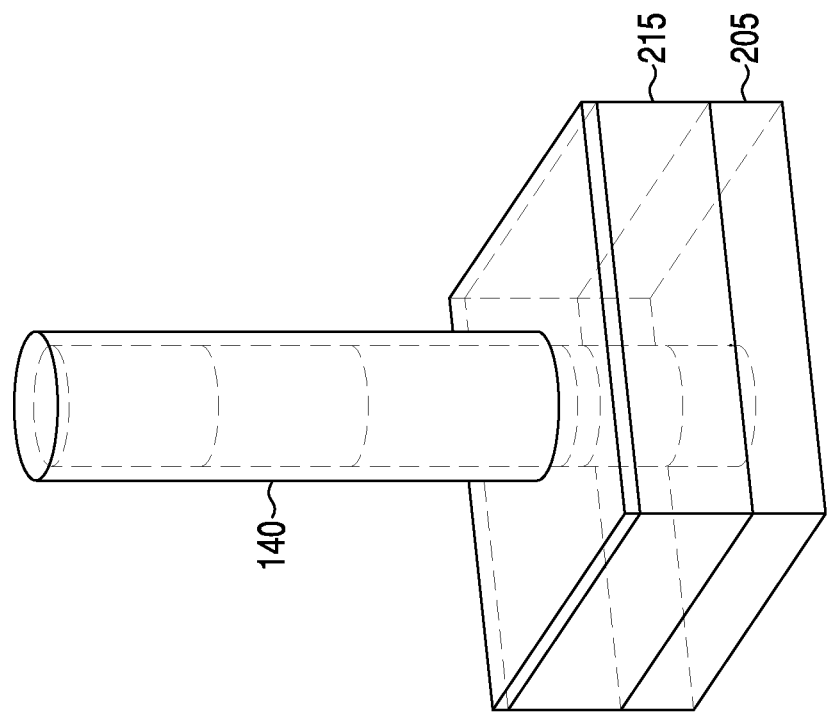
Figure 10B:
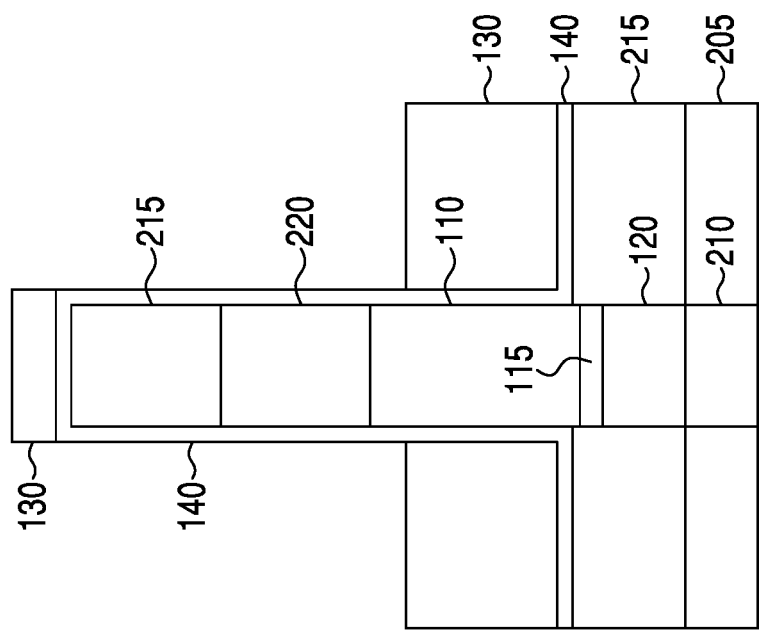
Figure 10A:
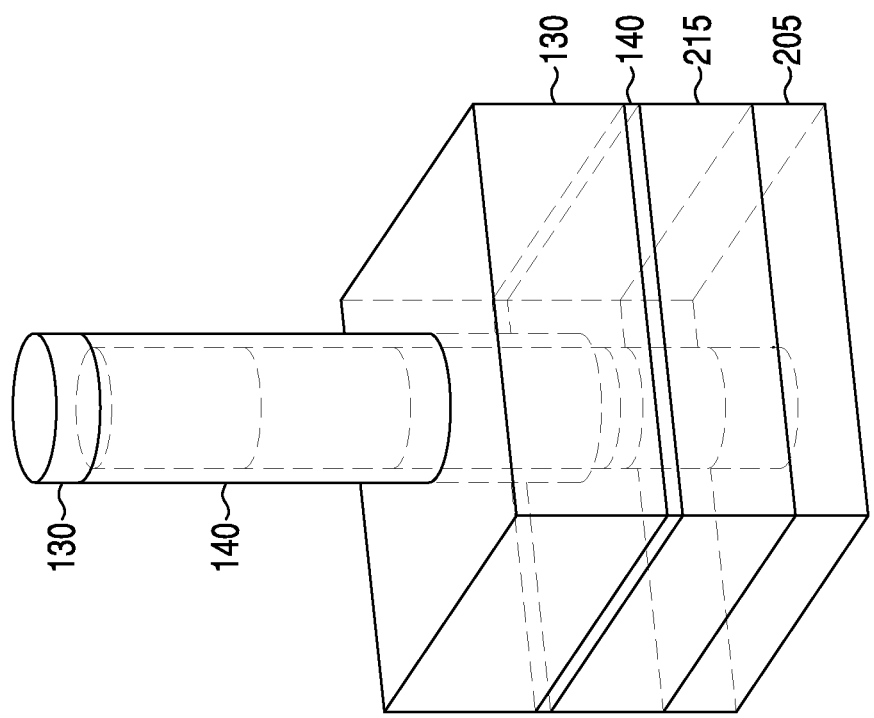
Figure 11B:
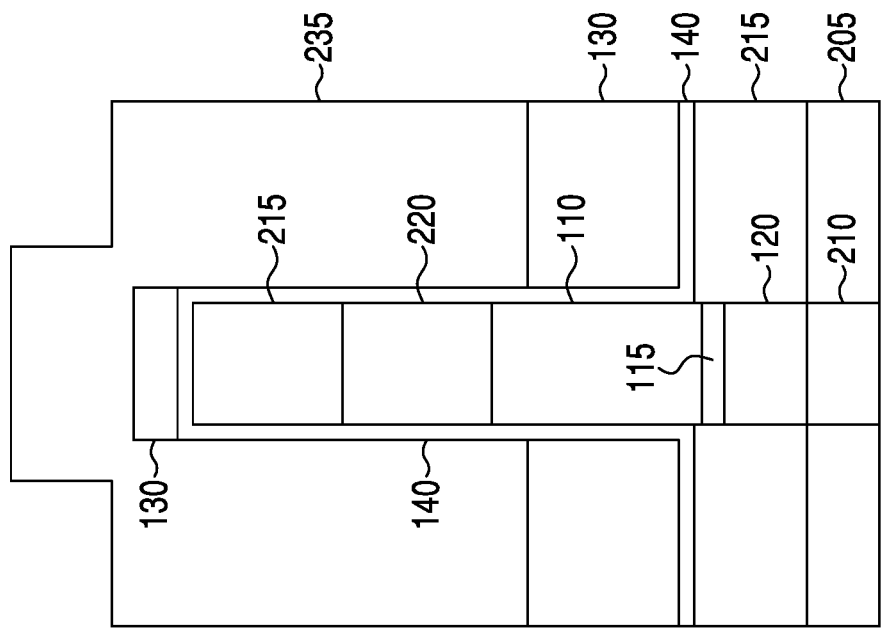
Figure 11A:
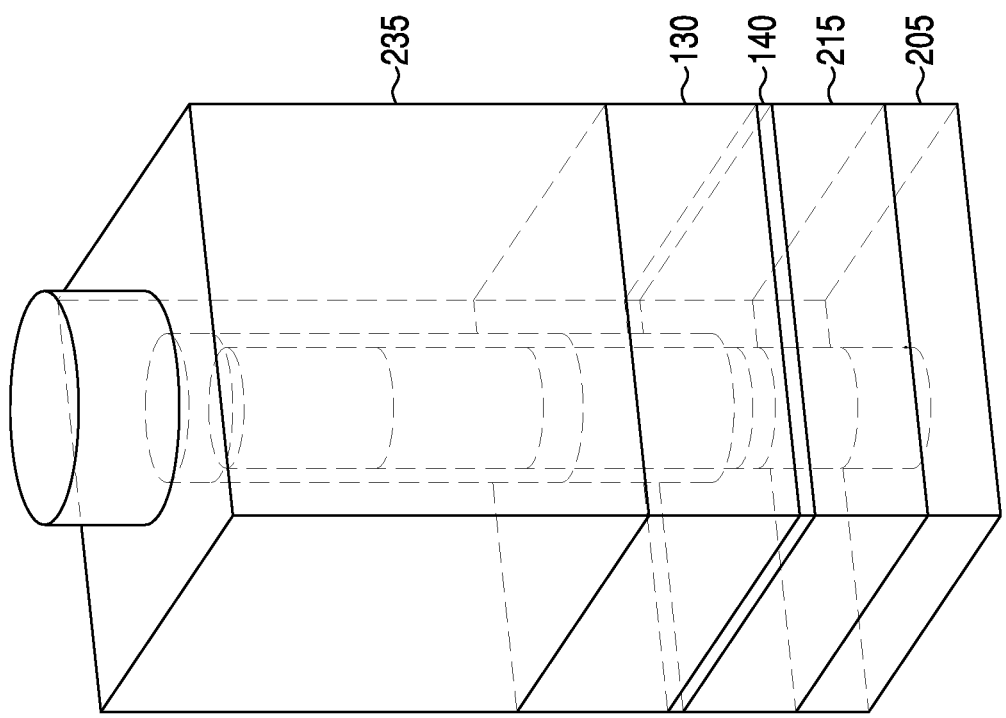
Figure 12B:
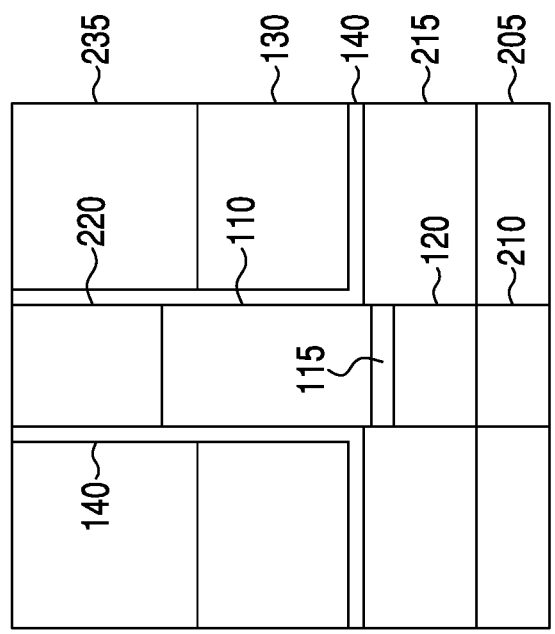
Figure 12A:
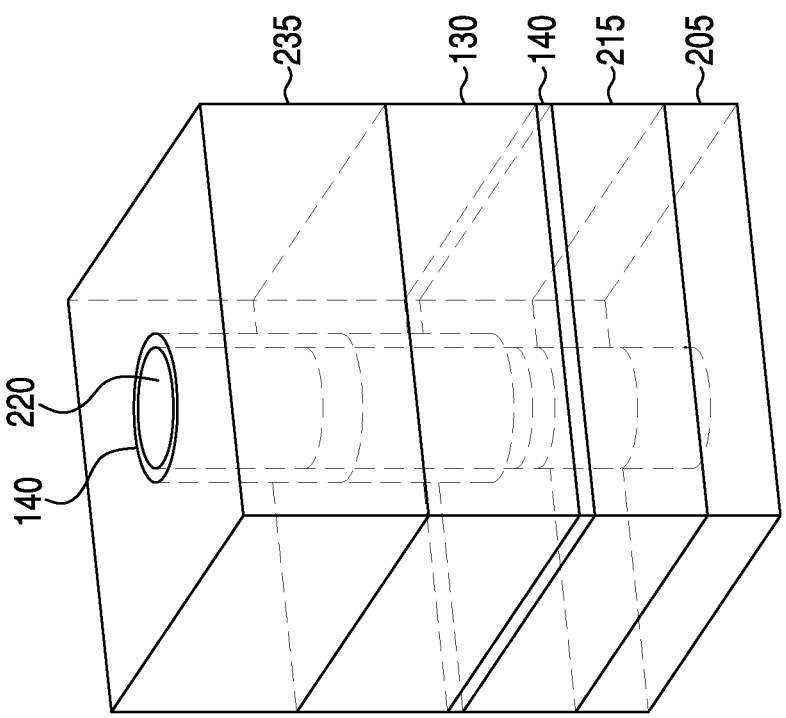
Figure 13B:
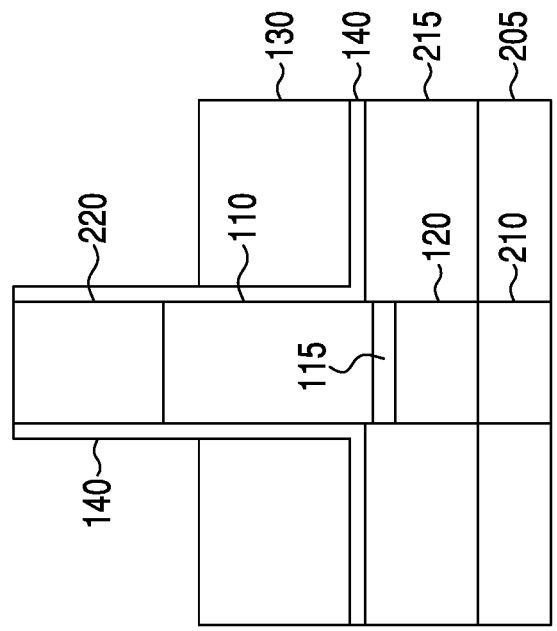
Figure 13A:
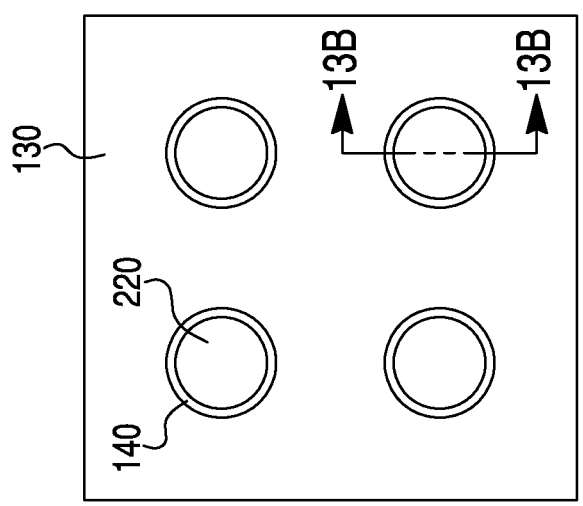
Figure 14B:
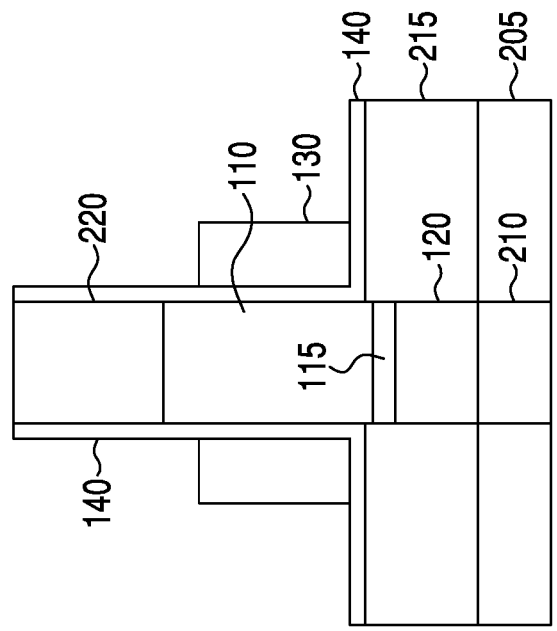
Figure 14A:
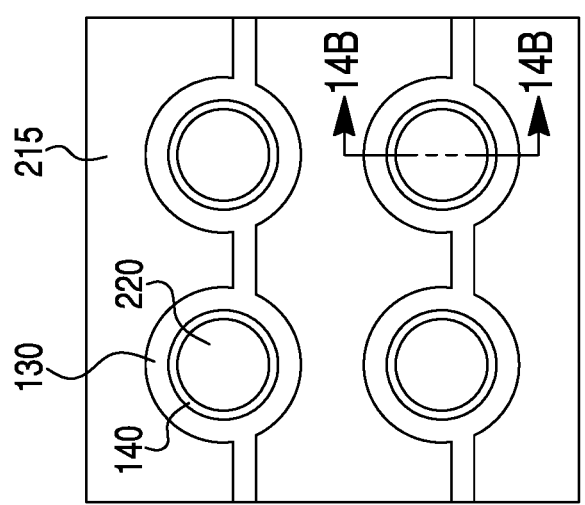
Figure 15B:
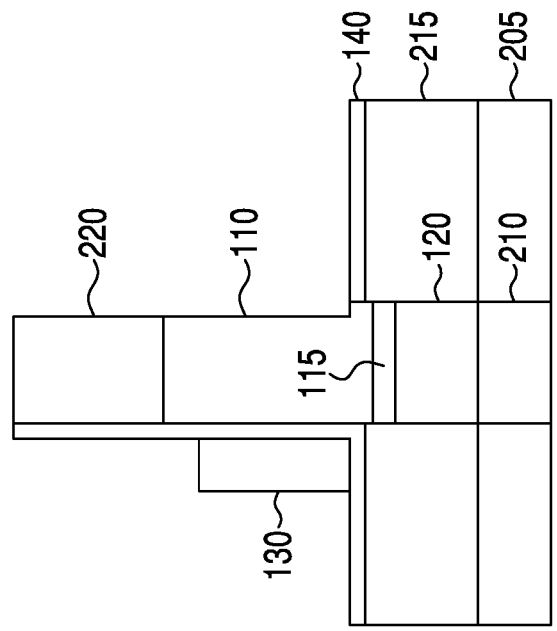
Figure 15A:
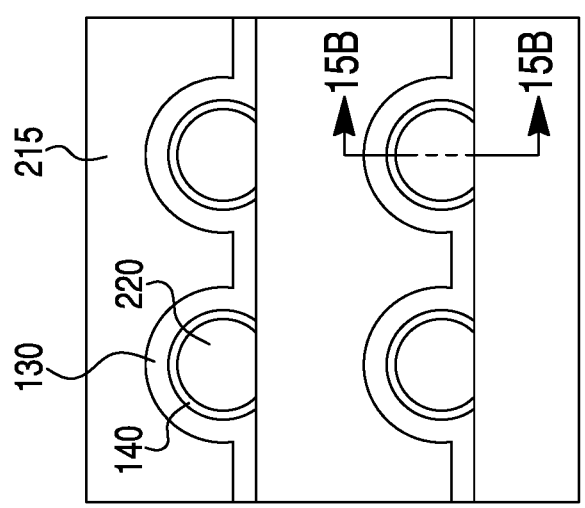
Figure 16:
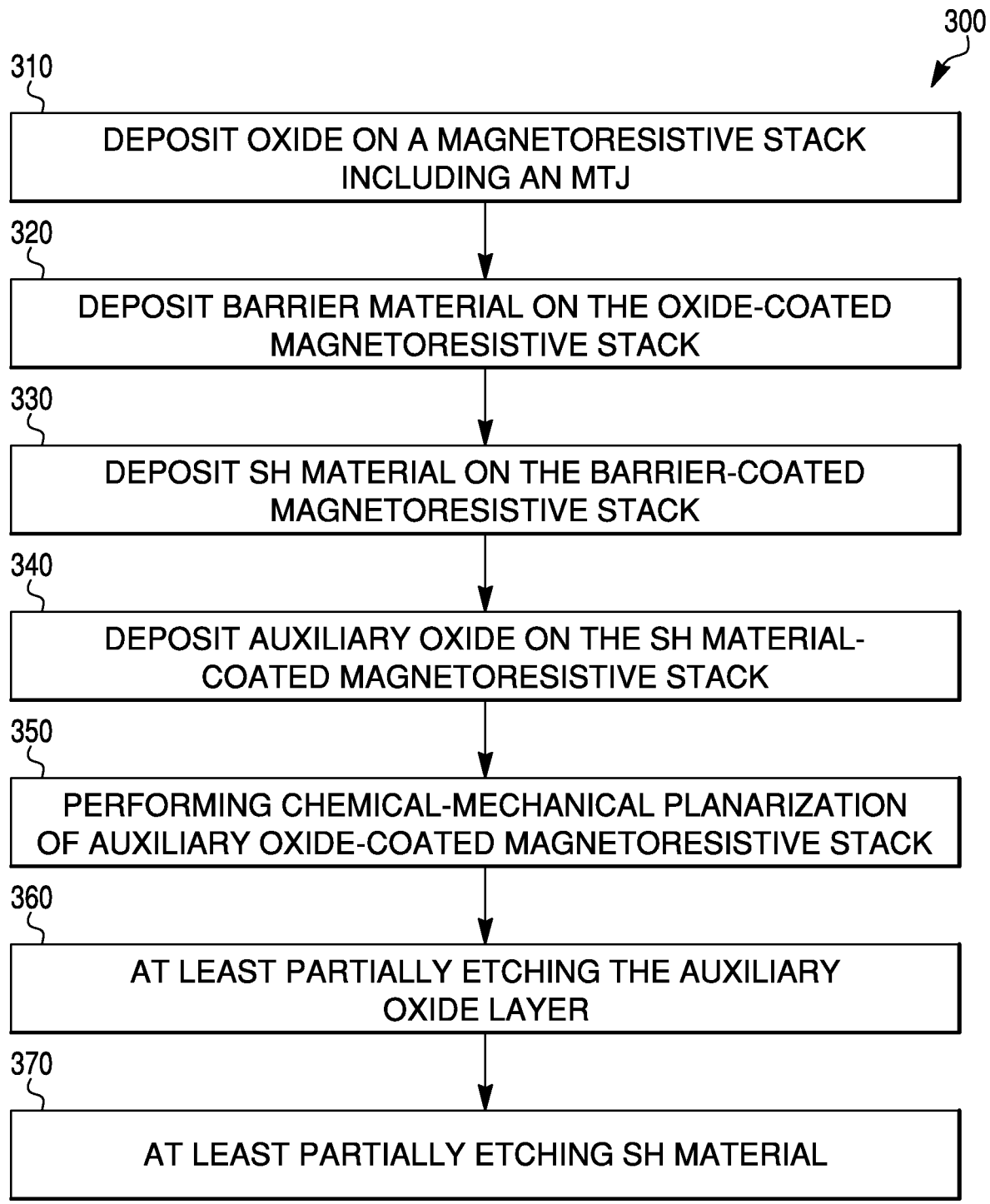
Figure 17:
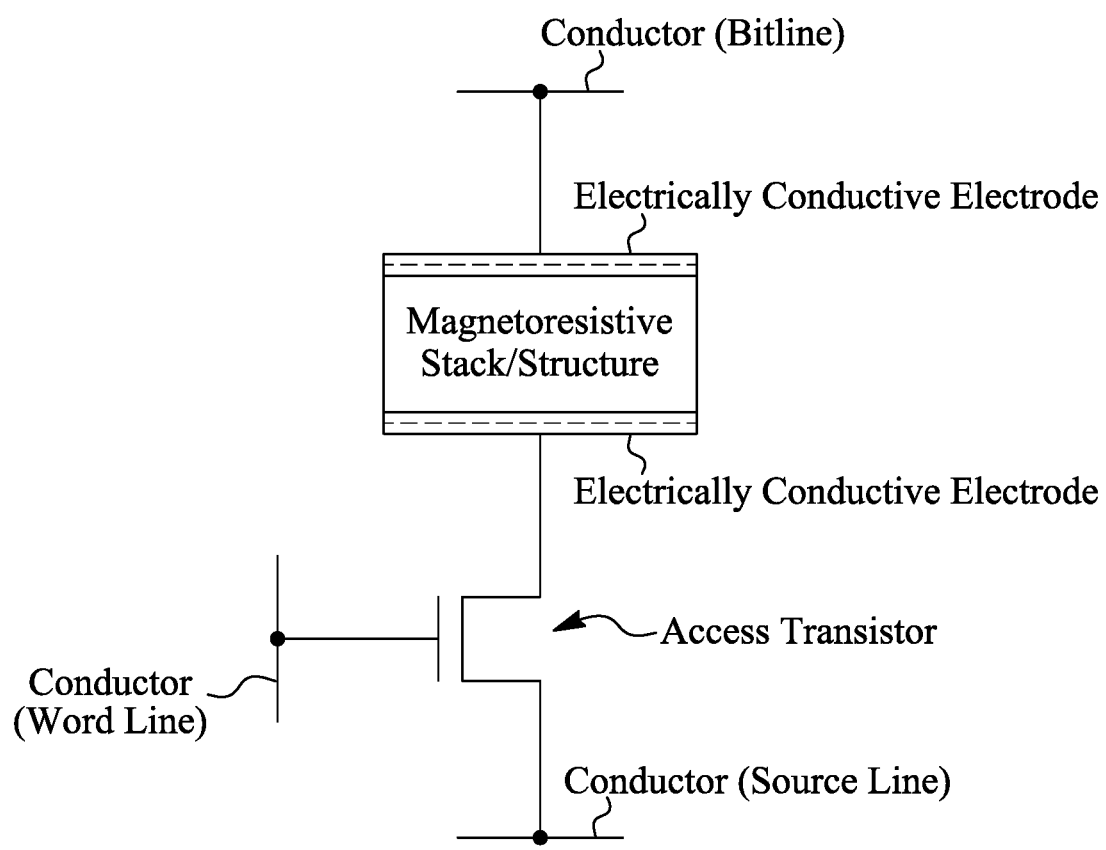
Figure 18A:
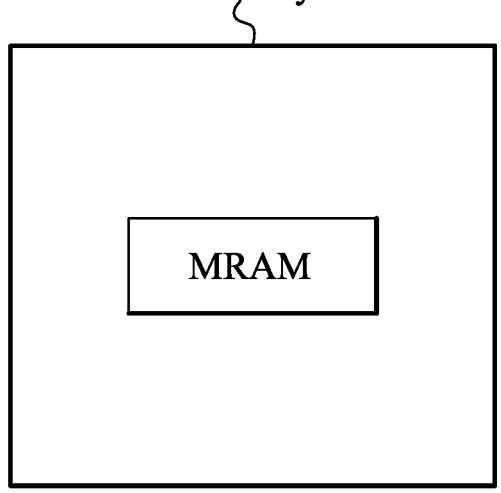
Figure 18B:
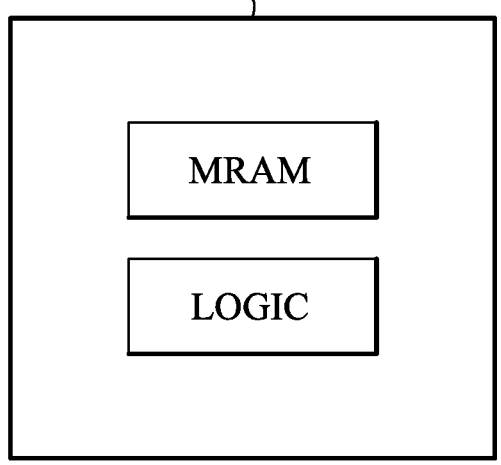

FIG. 1 illustrates a schematic diagram of a region of a magnetoresistive stack utilizing SOT and/or STT switching mechanisms, according to one or more embodiments of the present disclosure;

FIGS. 2A-2B illustrate schematic diagrams of a region of a magnetoresistive stack utilizing SOT and/or STT switching mechanisms, according to one or more embodiments of the present disclosure;

FIG. 3 illustrates a schematic diagram of a region of a magnetoresistive stack utilizing SOT and/or STT switching mechanisms, according to one or more embodiments of the present disclosure;

FIGS. 4A-4B illustrate schematic diagrams of a region of a magnetoresistive stack utilizing SOT and/or STT switching mechanisms, according to one or more embodiments of the present disclosure;

FIGS. 5A-5C illustrate schematic diagrams of a region of a magnetoresistive stack utilizing SOT and/or STT switching mechanisms, according to one or more embodiments of the present disclosure;

FIG. 6A illustrates a schematic diagram of a region of a magnetoresistive stack utilizing SOT and/or STT switching mechanisms, according to one or more embodiments of the present disclosure;

FIG. 6B illustrates a cross-sectional view depicting a schematic diagram of a region of a magnetoresistive stack utilizing SOT and/or STT switching mechanisms, according to one or more embodiments of the present disclosure;

FIG. 7A illustrates a magnetoresistive stack during one stage of manufacture, according to one or more embodiments of the present disclosure;

FIG. 7B illustrates a cross-sectional view depicting the magnetoresistive stack shown in FIG. 7A;

FIG. 8A illustrates a magnetoresistive stack during one stage of manufacture, according to one or more embodiments of the present disclosure;

FIG. 8B illustrates a cross-sectional view depicting the magnetoresistive stack shown in FIG. 8A;

FIG. 9A illustrates a magnetoresistive stack during one stage of manufacture, according to one or more embodiments of the present disclosure;

FIG. 9B illustrates a cross-sectional view depicting the magnetoresistive stack shown in FIG. 9A;

FIG. 10A illustrates a magnetoresistive stack during one stage of manufacture, according to one or more embodiments of the present disclosure;

FIG. 10B illustrates a cross-sectional view depicting the magnetoresistive stack shown in FIG. 10A;

FIG. 11A illustrates a magnetoresistive stack during one stage of manufacture, according to one or more embodiments of the present disclosure;

FIG. 11B illustrates a cross-sectional view depicting the magnetoresistive stack shown in FIG. 11A;

FIG. 12A illustrates a magnetoresistive stack during one stage of manufacture, according to one or more embodiments of the present disclosure;

FIG. 12B illustrates a cross-sectional view depicting the magnetoresistive stack shown in FIG. 12A;

FIG. 13A illustrates a top-down view depicting a magnetoresistive stack during one stage of manufacture, according to one or more embodiments of the present disclosure;

FIG. 13B illustrates a cross-sectional view depicting the magnetoresistive stack shown in FIG. 13A;

FIG. 14A illustrates a top-down view depicting a magnetoresistive stack during one stage of manufacture, according to one or more embodiments of the present disclosure;

FIG. 14B illustrates a cross-sectional view depicting the magnetoresistive stack shown in FIG. 14A;

FIG. 15A illustrates a top-down view depicting a magnetoresistive stack during one stage of manufacture, according to one or more embodiments of the present disclosure;

FIG. 15B illustrates a cross-sectional view depicting the magnetoresistive stack shown in FIG. 15A;

FIG. 16 is a flow chart illustrating an exemplary process for manufacturing a magnetoresistive stack utilizing SOT and/or STT switching mechanisms;

FIG. 17 is a schematic diagram of an exemplary magnetoresistive memory stack electrically connected to a select device, e.g., an access transistor, in a magnetoresistive memory cell configuration;

FIGS. 18A-18B are schematic block diagrams of integrated circuits including a discrete memory device and an embedded memory device, each including an MRAM (which, in one embodiments is representative of one or more arrays of MRAM having a plurality of magnetoresistive memory stacks according to aspects of certain embodiments of the present disclosure).

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

It should further be noted that, although exemplary embodiments are described in the context of MTJ stacks/structures, the present inventions may also be implemented in connection with giant magnetoresistive (GMR) stacks/structures where a conductor (e.g., a layer of copper) is disposed between two ferromagnetic regions/layers/materials. Embodiments of the present disclosure may be employed in connection with other types of magnetoresistive stacks/structures where such stacks/structures include a "fixed" magnetic region. For the sake of brevity, the discussions and illustrations presented in this disclosure will not be repeated specifically in the context of GMR or other magnetoresistive stacks/structures (e.g., anisotropic magnetoresistive (AMR) devices), but the discussion and drawings described below are to be interpreted as being entirely applicable to GMR and other magnetoresistive stacks/structures (e.g., AMR-type devices).

In this disclosure, the term "region" may be used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive devices may be referred to by specific names (e.g., bottom electrode, top electrode, positive Spin Hall (SH) material (i.e., with positive spin hall angle), negative SH material (i.e., with negative spin hall angle which is opposite to the spin hall angle of a "positive" SH material), "fixed" magnetic region, "free" magnetic region), this is only for ease of description and not intended as a functional description or relative location/orientation of the layer. Moreover, although the description below and the figures appear to depict a certain orientation of the layers relative to each other, those of ordinary skill in the art will understand that such descriptions and depictions are only exemplary. For example, though a "free" region of a magnetoresistive stack may be depicted as being "above" an intermediate layer of that stack, in some aspects the entire depicted magnetoresistive stack may be flipped such that the "free" region is "below" the intermediate layer.

In one exemplary embodiment, a magnetoresistive stack of a magnetoresistive device of the present disclosure may be implemented as a STT and/or SOT MRAM element. In such embodiments, the magnetoresistive stack may include an intermediate layer disposed (e.g., sandwiched) between two ferromagnetic regions to form an MTJ device or an MTJ-type device. Of the two ferromagnetic regions disposed on either side of the intermediate layer, one ferromagnetic region may be a "fixed" (or pinned) magnetic region, and the other ferromagnetic region may be a "free" magnetic region. The term "free" is intended to refer to ferromagnetic regions having a magnetic moment that may shift or move significantly in response to applied magnetic fields or spin-polarized currents used to switch the magnetic moment vector. Relatedly, the words "fixed" or "pinned" are used to refer to ferromagnetic regions having a magnetic moment vector that does not move substantially in response to such applied magnetic fields or spin-polarized currents. As is known in the art, an electrical resistance of the described magnetoresistive stack may change based on whether the magnetization direction (e.g., the direction of the magnetic moment) of the "free" region adjacent to the non-magnetic layer (e.g., a tunnel barrier) is in parallel alignment or in an antiparallel alignment with the magnetization direction (e.g., the direction of the magnetic moment) of the "fixed" region adjacent to the non-magnetic layer. Typically, if the two regions have the same magnetization alignment, the resulting relatively low resistance is considered as a digital "0," while if the alignment is antiparallel the resulting relatively higher resistance is considered to be a digital "1." A memory device (e.g., an MRAM) may include multiple magnetoresistive stacks, which may be referred to as memory cells or elements, arranged in an array of columns and rows. By measuring the current through each cell, the resistance of each cell, and thus the data stored in the memory array can be read.

In a magnetoresistive device utilizing SOT switching mechanics, switching the magnetization of the "free" region of a magnetoresistive stack may be accomplished by driving a current pulse through a spin-Hall (SH) material proximate (e.g., in contact with or near) the "free" region. The polarity of the current pulse and the polarity of the SH material determines the direction in which the magnetic moment of "free" region is transposed. SH material may have a positive spin hall angle or a negative spin hall angle. SH materials with positive spin hall angle may be referred to herein as positive SH materials, while SH materials with negative spin hall angle may be referred to herein as negative SH materials. The terms "positive" and "negative" as used in this context are relative terms only, where positive indicates the material causes, e.g. a clockwise spin current relative to the direction of the current pulse passing through the SH material, and negative indicates the material causes, e.g., a counter-clockwise spin current relative to the direction of the current pulse through the SH material. Examples of SH materials include, but are not limited to, platinum (Pt), beta-tungsten (β-W), tantalum (Ta), palladium (Pd), hafnium (Hf), gold (Au), alloys including gold (e.g., AuPt, AuCu, AuW), alloys including bismuth (Bi) and selenium (Se) (e.g., $Bi_2Se_3$ or $(BiSe)_2Te_3$), alloys including copper (Cu) and one or more of platinum (Pt), bismuth (Bi), iridium (Ir), or lead (Pb) (e.g., CuPt alloys, CuBi alloys, CuIr alloys, CuPb alloys), alloys including silver (Ag) and bismuth (Bi) (e.g., AgBi alloys), alloys including manganese (Mn) and one or more of platinum (Pt), iridium (Ir), palladium (Pd), or iron (Fe) (e.g., PtMn alloys, IrMn alloys, PdMn alloys, FeMn alloys), or combinations thereof. In one or more embodiments, platinum (Pt), palladium (Pd), gold (Au), alloys including bismuth (Bi) and selenium (Se), CuIr alloys, and CuPt alloys may act as a positive SH material, while beta-tungsten (β-W), tantalum (Ta), hafnium (Hf), CuBi alloys, CuPb alloys, and alloys including silver (Ag) and bismuth (Bi) alloys may act as a negative SH material. In some embodiments, an SH material may act as either a positive SH material or a negative SH material depending on the mode and manner of deposition.

The mean current required to be passed through a "free" region in order to change its magnetic state may be referred to as the critical current (Ic). The critical current is indicative of the current required to "write" data in a magnetoresistive memory cell. Reducing the critical current is desirable so that, among other things, a smaller access transistor can be used for each memory cell and that a higher density, lower cost memory can be produced. A reduced critical current may also lead to greater longevity and/or durability of a magnetoresistive memory cell.

Embodiments described herein may utilize what may be referred to as spin current to switch or aid in switching the magnetic state of the "free" region in an MTJ or MTJ-like device. Current through an SH material adjacent to (and/or in contact with) the "free" region results in a spin torque acting on the "free" region due to the injection of a spin current into the "free" region from the spin-dependent scattering of electrons in the SH material. The spin current is injected into the "free" region in a direction perpendicular to the boundary (or interface) where the "free" region and the SH material meet, and orthogonal to the direction of the current flow. The spin torque applied to the "free" region by the spin current impacts the magnetic state of the "free" region in a manner similar to spin-polarized tunneling current that flows through the MTJ in traditional STT magnetic tunnel junctions. As the function of STT magnetic tunnel junctions is well known in the art, it will not be further described here.

As with write currents in conventional STT MTJ devices, in devices using SOT switching mechanisms, the direction of torque applied by the spin current is dependent on the direction of the current flow in the SH material. In other words, the direction of current flow within the SH material proximate to the "free" region determines the direction of torque that is applied to the "free" region. Accordingly, the "free" region may be able to be switched between two stable states based on torque applied by current flowing in the proximate SH material in one direction or the other. In some embodiments, the "free" region may be able to be switched between two stable magnetic states based on the torque applied by a STT current flowing in either direction through the MTJ. The magnetic state of the "free" region may also be switching by the torque resulting from both an STT current by applying an electrical current through MTJ bit and the spin torque by a spin current injected from one or more SH materials by applying an electrical current through one or more SH materials.

In some embodiments, the torque applied by the spin current (i.e., SOT current) alone is used to switch the "free" region into a particular magnetic state, whereas in other embodiments, the spin current works as an "assist" to reduce the magnitude of an STT write current required to switch the magnetic state of the "free" region, where the STT write current travels through the entirety of the MTJ stack to produce a spin polarized tunneling current between the "free" region and "fixed" region. Reading of data stored by the MTJ stack is accomplished as in a conventional STT MTJ device. For example, a read current, having a magnitude less than that of the critical current of the MTJ stack, is applied to the MTJ stack to sense the resistance of the MTJ stack. As a person of ordinary skill in the art would recognize, there are many techniques that may be used to detect or sense the resistance of the MTJ stack. In some embodiments, the resistance sensed based on the read current can be compared with a reference resistance to determine the state of the "free" region. In some embodiments, a self-referenced read operation is performed where the resistance through the MTJ is sensed, then the MTJ is written (or reset) so that the "free" region is in a known state, then the resistance is sensed again and compared with the resistance originally sense. The original state of the "free" region can then be determined based on whether the resistance sense has changed based on the write or reset operation. In still other embodiments, a mid-point reference read operation may be performed.

For the sake of brevity, conventional techniques related to semiconductor processing may not be described in detail herein. The exemplary embodiments may be fabricated using known lithographic processes. The fabrication of integrated circuits, microelectronic devices, microelectric mechanical devices, microfluidic devices, and photonic devices involves the creation of several layers or regions (e.g., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of the developer. An etch may then be employed/applied whereby the layer (or material) not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack having one or more electrically conductive electrodes, vias, or conductors on either side of a magnetic material stack. As described in further detail below, the magnetic material stack may include many different regions of material, where some of these regions include magnetic materials, whereas others do not. In one embodiment, the methods of manufacturing include sequentially depositing, growing, sputtering, evaporating, and/or providing (which may be referred to collectively herein as "depositing") regions which after further processing (e.g., etching) form a magnetoresistive stack.

In some embodiments, the disclosed magnetoresistive stacks may be formed between a top electrode/via/line and a bottom electrode/via/line and which permit access to the stack by allowing for connectivity (e.g., electrical) to circuitry and other elements of the magnetoresistive device. Between the electrodes/vias/lines are multiple regions, including at least one "fixed" magnetic region (which may be referred to hereinafter as a "fixed" region) and at least one "free" magnetic region (which may be referred to hereinafter as a "free" region) with one or more intermediate layers (e.g., a dielectric layer) that forms a tunnel barrier between the "fixed" region and the "free" region. Each of the "fixed" region and the "free" region may include, among other things, a plurality of ferromagnetic layers. In some embodiments, the "fixed" region (e.g., "fixed" region 20 discussed below) may include a synthetic antiferromagnet (SAF). In some embodiments, a top electrode (and/or) bottom electrode may be eliminated and a bit line may be formed on top of the stack. Additionally, each magnetoresistive stack may be disposed proximate to an SH material. The SH material may be configured to carry current and imparts spin current on the "free" region during write and reset operations. In one or more embodiments, one or more electrodes of a magnetoresistive stack may include an SH material. In other embodiments, a magnetoresistive stack may be formed between a top electrode and a bottom electrode and proximate to an SH material, the SH material being independently connected to a current source. In such embodiments, the magnetoresistive stack or device may be referred to as a three-terminal magnetoresistive device.

Referring now to FIGS. 1-6B, various switching geometries (e.g., the relative location and orientation of the "free" region and one or more SH materials) are shown. The simplified illustrations in FIGS. 1-6B do not show all regions and layers of an exemplary magnetoresistive stack, but instead are intended to illustrate the relative location and positioning of several exemplary switching geometries and the direction of spin current generated by one or more SH materials. Further, although the regions depicted in FIGS. 1-6B are rectangular in shape, this is for simplicity and clarity only. The magnetoresistive stacks described herein may have a rectangular, trapezoidal, pyramidal, cylindrical, or other shape.

In some embodiments, the magnetoresistive stacks of the present disclosure, specifically the "free" regions of the magnetoresistive stacks may utilize a high aspect ratio (e.g., have a height greater than or equal to a width or a diameter) or may be otherwise bar-shaped. One or more "free" regions as described herein may include cobalt (Co), nickel (Ni), iron (Fe), boron (B), or other ferromagnetic materials.

Referring now to FIG. 1, a magnetoresistive device may include an intermediate layer 115 disposed above and in contact with a "fixed" region 120. A "free" region 110 may be provided above and in contact with the intermediate layer 115, opposite the "fixed" region 120. In some embodiments, an SH material 130 (e.g., a positive SH material or a negative SH material) may be disposed adjacent to and in contact with the "free" region 110. That is, the SH material may be in contact with only the "free" region 110, and not with the intermediate layer 115 or the "fixed" region 120. In some embodiments, the SH material 130 may extend along a width of the "free" region 110. In other embodiments, the SH material 130 may extend only partially along a width of the "free" region 110. In some embodiments, the SH material 130 may contact a top edge of the "free" region 110 and/or a bottom edge of the "free" region 110. The SH material 130 may have a height less than or equal to the height of "free" region 110. As alluded to above, the SH material 130 may not touch the intermediate layer 115. Contact of the SH material 130 to the intermediate layer 115 may result in a shorting of the MTJ, which inhibits the ability of the magnetoresistive stack to store data. In some embodiments, when electrons flow downward through the stack, SH material 130 may impart a spin current to "free" region 110 in a direction perpendicular to the interface of the SH material 130 and "free" region 110, and orthogonal to the direction of electron flow, as shown in FIG. 1. In one or more embodiments, the SH material 130 may radially cover 20°-120° of "free" region 110 in a plane perpendicular to the interface of the SH material 130 and "free" region 110.

Referring to FIG. 2A, a magnetoresistive device may include an intermediate layer 115 disposed above and in contact with a "fixed" region 120. A "free" region 110 may be above and in contact with the intermediate layer 115, opposite the "fixed" region 120. In some embodiments, a barrier 140 may be disposed between the "free" region 110 and the SH material 130. The barrier 140 may be in contact with both the "free" region 110 and the SH material 130. In some embodiments, the SH material 130 does not contact the "free" region 110. As described previously, SH material 130 may extend along a width of the "free" region 110 or the SH material 130 may extend only partially along a width of the "free" region 110. The barrier 140 may have a width greater than or equal to SH material 130. In some embodiments, barrier 140 may have a height greater than or equal to SH material 130. Barrier 140 may extend from the top edge of "free" region 110. In some embodiments, barrier 140 does not extend past the bottom edge of "free" region 110. In other embodiments, barrier 140 may extend from the top edge of "free" region 110 to the bottom edge of "fixed" region 120, as shown in FIG. 2B. In still other embodiments, barrier 140 may extend from a position adjacent to (and in contact with) "free" region 110 to a position adjacent to (and in contact with) "fixed" region 120. In one or more embodiments, barrier 140 (and indirectly SH material 130) may radially cover 20°-120° "free" region 110 in a plane perpendicular to the interface of barrier 140 and "free" region 110. As alluded to above, barrier 140 may isolate SH material 130 from "free" region. In some embodiments, when electrons flow downward through the stack, SH material 130 may impart a spin current to "free" region 110 in a direction perpendicular to the interface of the barrier 140 and "free" region 110, and orthogonal to the direction of electron flow, as shown in FIGS. 2A-2B.

Referring to FIG. 3, a magnetoresistive device may include an intermediate layer 115 disposed above and in contact with a "fixed" region 120. A "free" region 110 may be above and in contact with the intermediate layer 115, opposite the "fixed" region 120. In some embodiments, a positive SH material 130 is placed adjacent to and in contact with "free" region 110. A negative SH material 135 may be placed adjacent to and in contact with "free" region 110, opposite of positive SH material 130. As described previously, the terms "positive" and "negative" as related to SH materials are relative terms only. It should be understood that a positive SH material 130 may be replaced with a negative SH material 135 and a negative SH material 135 may be replaced by a positive SH material 130 without departing from the scope of the present disclosure. The positive SH material 130 and negative SH material 135 may be configured such that a current traveling through them in the same direction (e.g., from the top electrode to the bottom electrode or from the bottom electrode to the top electrode) will apply torque on the magnetic moment of the "free" region 110 in the same direction. In some embodiments, each of the positive SH material 130 and the negative SH material 135 may extend along a width of the "free" region 110. In other embodiments, the positive SH material 130 and/or the negative SH material 135 may extend only partially along a width of the "free" region 110.

In some embodiments, the positive SH material 130 and/or negative SH material 135 may contact a top edge of the "free" region 110 and/or a bottom edge of the "free" region 110. The positive SH material 130 and/or the negative SH material 135 may have a height less than or equal to the height of "free" region 110. In some embodiments, the positive SH material 130 and negative SH material 135 have about the same dimensions and/or may be on opposing sides of "free" region 110. In other embodiments, the positive SH material 130 may have a dimension greater than or equal to the corresponding dimension of the negative SH material 135. In still other embodiments, the negative SH material 135 may have a dimension greater than or equal to corresponding dimension of the positive SH material 130. In one or more embodiments, positive SH material 130 may radially cover 20°-180° of "free" region 110 in a plane perpendicular to the interface of the positive SH material 130 and "free" region 110. Additionally, or in the alternative, negative SH material 135 may independently radially cover 20°-180° of "free" region 110 in a plane perpendicular to the interface of the negative SH material 135 and "free" region 110. In some embodiments, when electrons flow downward through the stack, positive SH material 130 may impart a spin current to "free" region 110 in a direction perpendicular to the interface of the positive SH material 130 and "free" region 110, and orthogonal to the direction of electron flow. Similarly, when electrons flow downward through the stack, negative SH material 135 may impart a spin current to "free" region 110 in a direction perpendicular to the interface of negative SH material 135 and "free" region 110, and orthogonal to the direction of electron flow, as shown in FIG. 3.

Referring to FIG. 4A, a magnetoresistive device may include an intermediate layer 115 disposed above and in contact with a "fixed" region 120. A "free" region 110 may be above and in contact with the intermediate layer 115, opposite the "fixed" region 120. In some embodiments, one or more barriers 140 may be disposed between the "free" region 110 and the SH materials 130, 135. A barrier 140 may be associated with only one SH material 130 or 135 and not with the other SH material. In some embodiments, such as the ones shown in FIGS. 4A-4B, a magnetoresistive stack includes two barriers 140, one disposed between positive SH material 130 and "free" region 110 and another disposed between negative SH material 135 and "free" region 110. Each barrier 140 may be in contact with both the "free" region 110 and an SH material 130, 135. In some embodiments, neither SH material 130, 135 contacts the "free" region 110. As described previously, SH materials 130, 135 may extend along a width of the "free" region 110 or the SH materials 130, 135 may extend only partially along a width of the "free" region 110. The one or more barriers 140 may have a width greater than or equal to a width of the SH material 130, 135 with which they are in contact. In some embodiments, barrier 140 may have a height greater than or equal to a height of the SH material 130,135 with which they contact. Barrier 140 may extend from the top edge of "free" region 110. In some embodiments, barrier 140 does not extend past the bottom edge of "free" region 110. In other embodiments, barrier 140 may extend from the top edge of "free" region 110 to the bottom edge of "fixed" region 120, as shown in FIG. 4B. In still other embodiments, barrier 140 may extend from a position adjacent to (and in contact with) "free" region 110 to a position adjacent to (and in contact with) "fixed" region 120. In one or more embodiments, barrier 140 (and indirectly the SH material 130) may radially cover 35°-270° of "free" region 110 in a plane perpendicular to the interface of barrier 140 and "free" region 110. In some embodiments, when electrons flow downward through the stack, positive SH material 130 may impart a spin current to "free" region 110 in a direction perpendicular to the interface of barrier 140 and "free" region 110, and orthogonal to the direction of electron flow. Similarly, when electrons flow downward through the stack, negative SH material 135 may impart a spin current to "free" region 110 in a direction perpendicular to the interface of barrier 140 and "free" region 110, and orthogonal to the direction of electron flow, as shown in FIGS. 4A-4B.

Referring to FIG. 5A, a magnetoresistive device may include an intermediate layer 115 disposed above and in contact with a "fixed" region 120. A "free" region 110 may be above and in contact with the intermediate layer 115, opposite the "fixed" region 120. In some embodiments, a barrier 140 may be disposed between the "free" region 110 and the SH material 130. The barrier 140 may be in contact with both the "free" region 110 and the SH material 130. In some embodiments, the SH material 130 does not contact the "free" region 110. As described previously, SH material 130 may extend along a width of the "free" region 110 or the SH material 130 may extend only partially along a width of the "free" region 110. The barrier 140 may have a width greater than or equal to a width of the SH material 130. In some embodiments, barrier 140 may have a height greater than or equal to a height of the SH material 130. In one or more embodiments, SH material 130 may have a non-uniform thickness. For example, as depicted in FIG. 5A, portions of SH material 130 may extend laterally outwards away from "free" region 110. In another embodiment, as shown in FIG. 5B, portions of the SH material 130 may extend past an edge of barrier 140 and further extend at approximately a 90° angle laterally outwards away from "free" region 110. In such embodiments, SH material 130 may have two or more dimensions greater than one or more of barrier 140 or "free" region 110. In one or more embodiments, portions of SH material 130 may have a thickness sufficient to impart a spin current to "free" region 110 with enough magnitude to change the magnetic state of "free" region 110. In some embodiments, the bit line may be connected to one or more portions of the SH material 130 extending laterally away from "free" region 110, forming a three-terminal device (e.g., a first terminal connected to the SH material, a second terminal connected to the top electrode, and a third terminal connected to the bottom electrode).

With renewed reference to FIG. 5A, barrier 140 may extend from the top edge of "free" region 110. In some embodiments, barrier 140 does not extend past the bottom edge of "free" region 110. In other embodiments, as shown in FIG. 5B, barrier 140 may extend past the bottom edge of the SH material 130. In still other embodiments, barrier 140 may extend from the top edge of "free" region 110 to the bottom edge of "fixed" region 120, as shown in FIG. 5C. In still other embodiments, barrier 140 may extend from a position adjacent to (and in contact with) "free" region 110 to a position adjacent to (and in contact with) "fixed" region 120. In one or more embodiments, barrier 140 (and indirectly SH material 130) may radially cover approximately 35°-320° of "free" region 110 in a plane perpendicular to the interface of the barrier 140 and "free" region 110, allowing electrons to circulate around a majority of a circumference of the "free" region 110. In some embodiments, when electrons flow along SH material 130, a spin current may be imparted to "free" region 110 in a direction perpendicular to the flow of electrons, as shown in FIGS. 5A-5C. In some embodiments, this flow of electrons imparts enough torque to switch the magnetic moment of the "free" region 110 between two stable magnetic states.

Referring now to FIGS. 6A-6B, a magnetoresistive device may include an intermediate layer 115 disposed on and in contact with a "free" region 110. The magnetoresistive device may further include a "fixed" region 120 above and in contact with the intermediate layer 115. The "free" region 110, intermediate layer 115, and "fixed" region 120 may have the same or similar widths and/or flush edges, as shown in FIGS. 6A-6B. The magnetoresistive device shown in FIG. 6A may extend further "into the page" or "out of the page" with one or more additional layers formed "behind" or "in front" of the shown region. FIG. 6B represents an axial cross-section of the region shown in FIG. 6A. One or more barriers 140 may be positioned along the edge of "free" region 110, intermediate layer 115, and "fixed" region 120. The one or more barriers 140 may extend along a length of the "free" region 110, intermediate layer 115, and "fixed" region 120. As shown in FIGS. 6A-6B, the magnetoresistive device may include an in-plane MTJ. In one or more embodiments, a magnetoresistive stack includes two barriers 140 positioned on opposing sides of "free" region 110, intermediate layer 115, and "fixed" region 120. In one or more embodiments, the magnetoresistive stack may further include a barrier layer 140 disposed to the side of the "free" region 110 and in contact with both SH material 130 and "free" region 110 at the vertical interfaces. In one or more embodiments, the magnetoresistive stack may further include a barrier layer 140 disposed to the side of and below (or top) the "free" region 110 and in contact with both SH material 130 and/or "free" region 110 at the vertical and horizontal interfaces. The SH material 130 may extend across a width of "free" region 110 and/or along a length of "free" region 110. In some embodiments, SH material 130 may have a height greater than or equal to the height of barrier 140. SH material 130 may extend upwards past the top surface of "free" region 110 or may even extend past the top surface of "fixed" region 120. In some embodiments, the portions of the SH material 130 that extend upward past the top surface of "fixed" region 120 may be connected directly to the bit line, forming a three-terminal device. In some embodiments, the SH material 130 does not touch the intermediate layer 115 and/or the "fixed" region 120. In some embodiments, when electrons flow along SH material 130, a spin current may be imparted to "free" region 110 in a direction perpendicular to the interface of "free" region 110 and SH material 130, and orthogonal to the direction of electron flow, as shown in FIG. 6. In one or more embodiments, SH material 130 and "free" region 110 may be configured such that SH material 130 imparts a spin current to "free" region 110 of enough magnitude to switch "free" region 110 between stable magnetic states.

An exemplary method of manufacturing a magnetoresistive stack with SOT switching (e.g., a magnetoresistive stack including one of the geometries discussed above) will now be discussed with reference to FIGS. 7A-15B. It should be understood that although the exemplary method is discussed in the context of one specific switching geometry, the techniques, methods, and principles described herein are applicable to any of the described switching geometry embodiments. Further, aspects or features of one or more exemplary methods may be combined with aspects or features of any other described exemplary method. Additionally, as previously stated, commonly performed conventional techniques related to semiconductor processing may not be specifically described herein. Rather, the description herein is intended to highlight aspects of example methods of manufacturing a magnetoresistive stack utilizing STT and/or SOT switching.

FIG. 7A shows a magnetoresistive stack including an MTJ according to one or more embodiments of the present disclosure after, e.g., an etching process or lithographic microfabrication processing step. FIG. 7B shows a cross section of the magnetoresistive stack of FIG. 7A. Referring to FIGS. 7A-B, a magnetoresistive stack may include a bottom electrode 210, which may be integrated into or otherwise formed on a substrate 205 (e.g., a silica substrate). A "fixed" region 120 may be positioned above and in contact with the bottom electrode 210, and an intermediate layer 115 may be above and in contact with the "fixed" region 120. A "free" region 110 may be positioned above and in contact with intermediate layer 115 and a top electrode 220 may be above and in contact with "free" region 110. One or more oxides (e.g., silica) may be applied to the stack by, e.g., physical vapor deposition (PVD), other thin film fabrication processes, and/or other technique known in the art.

FIG. 8A shows a magnetoresistive stack that has been coated with oxide (i.e., an oxide-coated magnetoresistive stack), according to one or more embodiments. FIG. 8B shows a cross section of the magnetoresistive stack of FIG. 8A. Referring to FIGS. 8A-8B, in one or more embodiments, an oxide layer 215 is formed over the substrate 205 and/or the top electrode 220. In some embodiments, the oxide-coated magnetoresistive stack may include one or more oxide regions 215 disposed above and in contact with substrate 205. Oxide region 215 may cover the entire top surface of substrate 205. In other embodiments, only part of the top surface of substrate 205 is covered by oxide region 215. The oxide-coated magnetoresistive stack may further include an oxide region 215 disposed above and in contact with top electrode 220. In one or more embodiments, oxide may be applied such that an oxide region 215 completely covers the thickness of intermediate layer 115. In some embodiments, oxide region 215 may contact substrate 205, bottom electrode 120, intermediate layer 115, and/or free region 110. In further embodiments, oxide region 215 may be conformal around the magnetoresistive stack and cover the vertical side walls of one or more regions of the magnetoresistive stack. In one or more embodiments, a barrier material (e.g., MgO, metal oxide, SiN, metalloid conductor) may be deposited on an oxide-coated magnetoresistive stack by chemical vapor deposition (CVD), PVD, or other method known in the art.

FIG. 9A shows a magnetoresistive stack that has been coated with barrier material (i.e., a barrier-coated magnetoresistive stack), according to one or more embodiments. FIG. 9B shows a cross section of the barrier-coated magnetoresistive stack of FIG. 9A. Referring to FIGS. 9A-9B, in one or more embodiments, a barrier-coated magnetoresistive stack may include a barrier 140 disposed above and in contact with oxide region 215. Barrier 140 may contact oxide region 215, top electrode 220, and/or "free" region 110. In some embodiments, barrier 140 does not contact intermediate region 115. Barrier 140 may cover the entire height of "free" region 110. In one or more embodiments, an SH material 130 (e.g., platinum (Pt), beta-tungsten (β-W), and/or tantalum (Ta)) may be deposited on the barrier-coated magnetoresistive stack.

FIG. 10A shows a magnetoresistive stack that has been coated with SH material (i.e., an SH material-coated magnetoresistive stack), according to one or more embodiments. FIG. 10B shows a cross section of the magnetoresistive stack of FIG. 10A. Referring to FIGS. 10A-10B, an SH material-coated magnetoresistive stack may include SH material 130 disposed above and in contact with barrier 140. In some embodiments, the SH material 130 does not contact any layers/regions of the magnetoresistive stack other than barrier 140.

In one or more embodiments, an auxiliary oxide may be deposited on the SH material-coated magnetoresistive stack by PVD, other thin film fabrication method, or other method known in the art. FIG. 11A shows a magnetoresistive stack that has been coated with an auxiliary oxide (i.e., an auxiliary oxide-coated magnetoresistive stack), according to one or more embodiments. FIG. 11B shows a cross section of the auxiliary oxide-coated magnetoresistive stack of FIG. 11A. Referring to FIGS. 11A-11B, one or more auxiliary oxides 235 may be disposed above and in contact with SH material 130. In some embodiments auxiliary oxide 235 may also contact barrier 140.

In some embodiments, the auxiliary oxide-coated magnetoresistive stack may be etched, abraded, and/or otherwise polished (e.g., via chemical-mechanical planarization (CMP)). CMP is a process of evening surfaces through a combination of chemical and physical means. In some embodiments, the auxiliary-oxide coated magnetoresistive stack may be polished via any previously-described means to expose a surface of top electrode 220 flush with a top surface of auxiliary oxide 235, as shown in FIG. 12A (cross-section in FIG. 12B). A surface of barrier 140 may also be exposed that is flush with the top surface of auxiliary oxide 235. In some embodiments, after the magnetoresistive stack undergoes CMP to expose a surface of top electrode 220, the remaining auxiliary oxide 235 may be etched (e.g., angled etch or oblique etch) or otherwise ablated from the magnetoresistive stack.

FIG. 13A shows a top-down view of an array of magnetoresistive stacks including MTJs after the auxiliary oxide has been removed, according to one or more embodiments. FIG. 13B shows a cross-section of one magnetoresistive stack of the array shown in FIG. 13A along line 13B-13B. As shown in FIGS. 13A-13B, the SH material 130 and barrier 140 radially cover 360° of "free" region 110 in a plane perpendicular to the interface of barrier 140 and "free" region 110. Further etching steps (angled etches, rotational etches, oblique etches) may be taken to create the switching geometries described within the present disclosure. For example, a first etching step may etch (e.g., angled etch or oblique etch) certain regions of the SH material 130 and expose regions of the barrier 140 above oxide region 215, as shown in FIGS. 14A-14B. In some embodiments, a second etching step (e.g., angled etch or oblique etch) may be taken to expose a surface of "free" region 110 by removing/ablating SH material 130 and barrier 140 from a portion of "free" region 110, as shown in FIGS. 15A-15B. Each magnetoresistive stack in the array of magnetoresistive stacks shown in FIG. 15A have the switching geometry shown in FIG. 5A. Similarly, any of the switching geometries described herein may be manufactured using the methods described above. After the SH material 130 and barrier 140 are etched to a desired geometry, further layers and/or connections may be made above and/or in contact with top electrode 220.

FIG. 16 is a flow chart of a method 300 of manufacturing a magnetoresistive stack utilizing STT and/or SOT switching, according to one or more embodiments of the present disclosure. The method 300 may include depositing an oxide on a magnetoresistive stack that includes an MTJ to form an oxide-coated magnetoresistive stack (step 310). The method 300 may further include depositing barrier material on the oxide-coated magnetoresistive stack to form a barrier-coated magnetoresistive stack (step 320). In some embodiments, the method 300 may include depositing SH material on the barrier-coated magnetoresistive stack (step 330). The method 300 may further include depositing an auxiliary oxide on the SH material-coated magnetoresistive stack (step 340). In some embodiments, the method 300 may include performing CMP on the auxiliary oxide-coated magnetoresistive stack (step 350). In one or more embodiments, performing CMP on the auxiliary oxide-coated magnetoresistive stack may expose a top electrode and/or barrier of the magnetoresistive stack. The method 300 may further include at least partially etching the auxiliary oxide layer (step 360). In some embodiments, all of the auxiliary oxide is etched or otherwise removed from the magnetoresistive stack. In one or more embodiments, method 300 may include at least partially etching SH material (step 370). In some embodiments, the method 300 may further include at least partially etching the barrier. The SH material and barrier may be etched in any pattern to form any of the exemplary switching geometries described herein.

As alluded to above, the magnetoresistive devices of the present disclosure, including one or more switching geometries described herein, may be implemented in a sensor architecture or a memory architecture (among other architectures). For example, in a memory configuration, the magnetoresistive devices may be electrically connected to an access transistor and configured to couple or connect to various conductors, which may carry one or more control signals, as shown in FIG. 17. The magnetoresistive devices of the current disclosure may be used in any suitable application, including, e.g., in a memory configuration. In such instances, the magnetoresistive devices may be formed as an integrated circuit comprising a discrete memory device (e.g., as shown in FIG. 18A) or an embedded memory device having a logic therein (e.g., as shown in FIG. 18B), each including MRAM, which, in one embodiment is representative of one or more arrays of MRAM having a plurality of magnetoresistive stacks, according to certain aspects of certain embodiments disclosed herein.

Although various embodiments of the present disclosure have been illustrated and described in detail, it will be readily apparent to those skilled in the art that various modifications may be made without departing from the present disclosure.

What is claimed is:

1. A magnetoresistive device comprising:
   a fixed region having a fixed magnetic state;
   a free region configured to have a first magnetic state and a second magnetic state, wherein the device stores a first value when the free region is in the first magnetic state and the device stores a second value when the free region is in the second magnetic state;
   a dielectric layer between the free region and the fixed region; and
   a spin-Hall (SH) material proximate to at least a portion of the free region, wherein current through the SH material generates spin current in a direction perpendicular to a plane between the SH material and the free region;
wherein the device is configured such that current may be passed through the SH material without passing through the free region.

2. The device of claim 1, wherein a current flowing in a first direction through the SH material switches the free region to the first magnetic state, and wherein a current flowing in a second direction switches the free region to the second magnetic state.

3. The device of claim 1, wherein the SH material is also proximate to at least a portion of the fixed region.

4. The device of claim 1, wherein the fixed region comprises a synthetic antiferromagnet.

5. The device of claim 1, wherein the SH material comprises at least one of platinum, beta-tungsten, tantalum, palladium, hafnium, gold, an alloy including gold, an alloy including bismuth and selenium, an alloys including copper, an alloy including manganese, iridium, selenium, or one or more combinations thereof.

6. The device of claim 1, wherein the SH material radially covers at least about 180° of the free region, in a plane perpendicular to an interface of the SH material and the free region.

7. The device of claim 6, wherein the SH material covering a first radial portion of the free region has a thickness greater than the SH material covering a second radial portion of the free region.

8. The device of claim 1, further comprising a barrier disposed between the SH material and the free region.

9. The device of claim 8, wherein the barrier has a height greater than or equal to a height of the SH material and/or the barrier has a width greater than or equal to a width of the SH material.

10. A magnetoresistive device comprising:
a fixed region having a fixed magnetic state;
a free region configured to have a first magnetic state and a second magnetic state, wherein the device stores a first value when the free region is in the first magnetic state and the device stores a second value when the free region is in the second magnetic state;
a dielectric layer between the free region and the fixed region;
a first spin-Hall (SH) material proximate to at least a portion of the free region, wherein current through the first SH material generates a first spin current in a direction perpendicular to a plane between the SH material and the free region;
a second SH material proximate to at least a portion of the free region, wherein current through the second SH material generates a second spin current having a polarity opposite a polarity of the first spin current.

11. The device of claim 10, wherein the first SH material and the second SH material are also proximate to at least a portion of the fixed region.

12. The device of claim 10, further comprising a first barrier, disposed between the first SH material and the free region, and a second barrier, disposed between the second SH material and the free region.

13. The device of claim 10, wherein the first SH material forms an interface with the free region and covers about 30° to about 180° of the free region, in a plane perpendicular to an interface of the first SH material and the free region; and
the second SH material forms an interface with the free region and covers about 30° to about 180° of the free region, in a plane perpendicular to an interface of the second SH material and the free region.

14. The device of claim 10, wherein the first SH material is disposed opposite the second SH material, relative to the free region.

15. The device of claim 10, wherein the first SH material comprises at least one of platinum, palladium, gold, an alloy including bismuth and selenium, CuIr alloy, CuPt alloy, or one or more combinations thereof; and
the second SH material comprises at least one of beta-tungsten, tantalum, hafnium, CuBi alloy, CuPb alloy, an alloy including silver and bismuth, or one or more combinations thereof.

16. A magnetoresistive device comprising:
a fixed region having a fixed magnetic state;
a free region;
a dielectric layer between the free region and the fixed region; and
a spin-Hall (SH) material that radially covers at least about 180° of the free region, in a plane perpendicular to an interface of the SH material and the free region, wherein the SH material covering a first radial portion of the free region has a thickness greater than the SH material covering a second radial portion of the free region.

17. The device of claim 16, wherein the free region is configured to have a first magnetic state and a second magnetic state, and wherein the device stores a first value when the free region is in the first magnetic state and the device stores a second value when the free region is in the second magnetic state.

18. The device of claim 16, further comprising a barrier disposed between the SH material and the free region.

19. The device of claim 16, wherein the device is configured such that current may be passed through the SH material without passing through the free region.

20. The device of claim 16, wherein the fixed region comprises a synthetic antiferromagnet.

* * * * *